(12) United States Patent
Arai et al.

(10) Patent No.: US 11,011,707 B2
(45) Date of Patent: May 18, 2021

(54) ORGANIC EL DISPLAY DEVICE

(71) Applicant: TORAY INDUSTRIES, INC., Tokyo (JP)

(72) Inventors: Takeshi Arai, Shiga (JP); Kazuto Miyoshi, Shiga (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 16/463,729

(22) PCT Filed: Nov. 29, 2017

(86) PCT No.: PCT/JP2017/042894
§ 371 (c)(1),
(2) Date: May 23, 2019

(87) PCT Pub. No.: WO2018/101356
PCT Pub. Date: Jun. 7, 2018

(65) Prior Publication Data
US 2019/0386217 A1      Dec. 19, 2019

(30) Foreign Application Priority Data

Dec. 1, 2016   (JP) .............................. JP2016-233898

(51) Int. Cl.
*H01L 51/00* (2006.01)
*G03F 7/033* (2006.01)
(Continued)

(52) U.S. Cl.
CPC ............ *H01L 51/004* (2013.01); *G03F 7/033* (2013.01); *G03F 7/037* (2013.01); *G03F 7/038* (2013.01); *G03F 7/0381* (2013.01); *G03F 7/162* (2013.01); *G03F 7/168* (2013.01); *G03F 7/2002* (2013.01); *G03F 7/322* (2013.01);
(Continued)

(58) Field of Classification Search
CPC .............................. H01L 27/32; H01L 51/004
See application file for complete search history.

(56) References Cited

U.S. PATENT DOCUMENTS 5,811,833 A    9/1998   Thompson
5,834,893 A   11/1998   Bulovic et al.
(Continued)

FOREIGN PATENT DOCUMENTS

CN    103946747 A    7/2014
CN    105789247 A    7/2016
(Continued)

OTHER PUBLICATIONS

International Search Report, issued in PCT/JP2017/042894, PCT/ISA/210, dated Feb. 27, 2018.
(Continued)

*Primary Examiner* — Moazzam Hossain
*Assistant Examiner* — Mohammad A Rahman
(74) *Attorney, Agent, or Firm* — Birch, Stewart, Kolasch & Birch, LLP

(57) ABSTRACT

The organic EL display device includes at least a transparent electrode, an organic EL layer, and a non-transparent electrode in this order and further includes a black insulating layer, and the non-transparent electrode has a reflectance of 25%±20%.

10 Claims, 3 Drawing Sheets

(51) Int. Cl.
  *G03F 7/037* (2006.01)
  *G03F 7/038* (2006.01)
  *G03F 7/16* (2006.01)
  *G03F 7/20* (2006.01)
  *G03F 7/32* (2006.01)
  *H01L 51/52* (2006.01)

(52) U.S. Cl.
  CPC ...... *H01L 51/5206* (2013.01); *H01L 51/5231* (2013.01); *H01L 51/5284* (2013.01); *H01L 2251/301* (2013.01)

(56) References Cited

U.S. PATENT DOCUMENTS

| | | | |
|---|---|---|---|
| 5,861,219 | A | 1/1999 | Thompson et al. |
| 5,874,803 | A | 2/1999 | Garbuzov et al. |
| 5,922,396 | A | 7/1999 | Thompson |
| 5,981,306 | A | 11/1999 | Burrows et al. |
| 5,986,401 | A | 11/1999 | Thompson et al. |
| 5,998,803 | A | 12/1999 | Forrest et al. |
| 6,045,930 | A | 4/2000 | Thompson et al. |
| 6,046,543 | A | 4/2000 | Bulovic et al. |
| 6,091,195 | A | 7/2000 | Forrest et al. |
| 6,125,226 | A | 9/2000 | Forrest et al. |
| 6,650,045 | B1 | 11/2003 | Forrest et al. |
| 2002/0162998 | A1 | 11/2002 | Okuda et al. |
| 2004/0178724 | A1 | 9/2004 | Karasawa et al. |
| 2004/0178725 | A1* | 9/2004 | Karasawa ........... H01L 51/5284 313/506 |
| 2005/0031901 | A1 | 2/2005 | Lee et al. |
| 2006/0202610 | A1 | 9/2006 | Karasawa et al. |
| 2014/0361265 | A1 | 12/2014 | Liu et al. |
| 2015/0223326 | A1 | 8/2015 | Lim et al. |
| 2016/0049615 | A1* | 2/2016 | Kim ................ H01L 51/5284 257/40 |
| 2016/0326405 | A1* | 11/2016 | Ii ............................ B32B 27/18 |
| 2018/0019290 | A1 | 1/2018 | Arai et al. |

FOREIGN PATENT DOCUMENTS

| | | | |
|---|---|---|---|
| CN | 105848879 | A | 8/2016 |
| JP | 2001-527688 | A | 12/2001 |
| JP | 2002-91343 | A | 3/2002 |
| JP | 2004-281365 | A | 10/2004 |
| JP | 2005-56848 | A | 3/2005 |
| JP | 2005-339957 | A | 12/2005 |
| JP | 2010-103105 | A | 5/2010 |
| JP | 10-2014-0097117 | | * 11/2011 |
| JP | 2015-533682 | A | 9/2015 |
| JP | 2015-197995 | A | 11/2015 |
| JP | 2015-533682 | A | 11/2016 |
| WO | WO 2013/069789 | A1 | 5/2013 |
| WO | WO 2015/098714 | A1 | 7/2015 |
| WO | WO 2016/143740 | A1 | 9/2016 |

OTHER PUBLICATIONS

Written Opinion of the International Searching Authority, issued in PCT/JP2017/042894, PCT/ISA/237, dated Feb. 27, 2018.
Chinese Office Action and Search Report for Chinese Application No. 201780070589.4, dated Sep. 29, 2020, with English translation of the Office Action.
Japanese Office Action for Japanese Application No. 2017-563146, dated Nov. 17, 2020, with English translation.
Japanese Office Action for Japanese Application No. 2017-563146, dated Mar. 16, 2021, with English translation.

* cited by examiner

ORGANIC EL DISPLAY DEVICE

FIELD

The present invention relates to an organic EL display device having a transparent electrode, an organic EL layer, a non-transparent electrode, and an insulating layer.

BACKGROUND

An organic EL display device has been attracting attention as a next-generation flat panel display. The organic EL display device is a self-luminous display device utilizing electroluminescence emitted from an organic compound, so that the angle of visibility can be made wide, high speed response can be attained, and an image with high contrast can be displayed. Furthermore, since the organic EL display device can be reduced in thickness and weight and can be flexible, in recent years, research and development have been actively conducted.

The organic EL display device can be categorized according to a light-emitting mechanism into a bottom-emission type that emits light toward a substrate and a top-emission type that emits light toward a side opposite to the substrate. In either type, it is required to efficiently extract light emitted in an organic EL (Electro Luminescence) layer. As an organic EL element of the top-emission type, an organic EL element whose anode electrode is made of a metal having a high reflectance has been proposed (see, for example, Patent Literature 1).

The organic EL display device has an insulating layer in order to separate pixels from each other. As the organic EL display device having the insulating layer, for example, there has been proposed a display device which includes a first electrode formed on a substrate, an insulating layer formed on the first electrode so as to partially expose the first electrode, and a second electrode provided to face the first electrode and in which the insulating layer is formed of a positive photosensitive polyimide (see, for example, Patent Literature 2).

CITATION LIST

Patent Literature

Patent Literature 1: Japanese Patent Application Laid-open No. 2005-56848
Patent Literature 2: Japanese Patent Application Laid-open No. 2002-91343

SUMMARY

Technical Problem

However, when an electrode having a high reflectance as described in Patent Literature 1 is used, reflection of external light increases, and reduction in contrast constitutes a problem. Furthermore, since light emission in an organic EL layer tends to be diffused to adjacent pixels due to the electrode having a high reflectance, color shift related to display quality also constitutes a problem.

In a display device described in Patent Literature 2, since an insulating layer is transparent and allows external light to pass therethrough, there arises the problem that the contrast is reduced due to external light reflection from an electrode under the insulating layer. Furthermore, since the insulating layer is transparent, light emission in an organic EL layer tends to be diffused to adjacent pixels, so that color shift also constitutes a problem.

In view of the above problems, it is an object of the present invention to provide an organic EL display device which suppresses external light reflection, is excellent in contrast, and reduces color shift.

Solution to Problem

An organic EL display device according to the present invention includes at least a transparent electrode, an organic EL layer, and a non-transparent electrode in this order and further includes a black insulating layer. The non-transparent electrode has a reflectance of 25%±20%.

Advantageous Effects of Invention

The organic EL display device of the present invention reflects less external light, is excellent in contrast, and can reduce color shift.

DESCRIPTION OF EMBODIMENTS

Below, a description is given in detail of modes for carrying out the present invention (hereinafter referred to as "embodiments") with reference to the attached drawings. The present invention should not be limited only by the embodiments described below.

Figure 1:
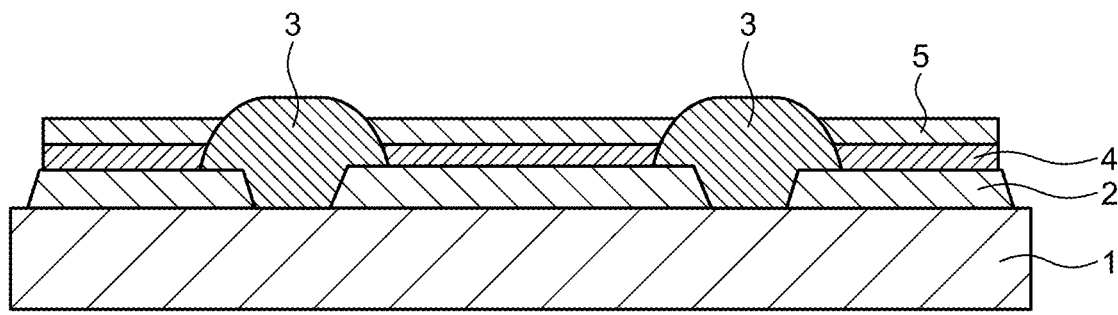
FIG. 1 is a schematic cross-sectional view of an organic EL display device of a bottom-emission type.
Figure 2:
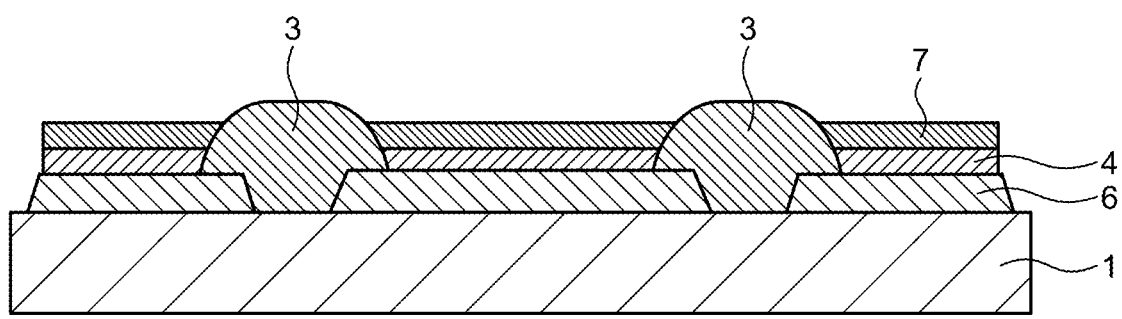
FIG. 2 is schematic cross-sectional view of an organic EL display device of a top-emission type.

An organic EL display device of the present invention has a transparent electrode, an organic EL layer, and a non-transparent electrode in this order, and further has an insulating layer. FIG. 1 illustrates a schematic cross-sectional view of an organic EL display device of a bottom-emission type as an embodiment, and FIG. 2 illustrates a schematic cross-sectional view of an organic EL display device of a top-emission type as another embodiment. The organic EL display device of the bottom-emission type of FIG. 1 has, on a substrate 1, a first electrode 2 formed of a transparent electrode. This organic EL display device further has an insulating layer 3 such that the insulating layer 3 covers a periphery of the first electrode 2, and furthermore has an organic EL layer 4 and a second electrode 5 formed of a non-transparent electrode. While the first electrode 2 is transparent, the second electrode 5 is non-transparent, so that emitted light in the organic EL layer 4 is extracted to the substrate 1 side. The organic EL display device of the top-emission type of FIG. 2 has, on the substrate 1, a first electrode 6 formed of a non-transparent electrode. This organic EL display device further has the insulating layer 3 such that the insulating layer 3 covers a periphery of the first electrode 6, and furthermore has the organic EL layer 4 and a second electrode 7 formed of a transparent electrode. The first electrode 6 formed of the non-transparent electrode and the second electrode 7 formed of the transparent electrode are selected, whereby emitted light in the organic EL layer 4 is extracted to the side opposite to the substrate 1.

Although organic EL display devices are roughly divided into an active matrix type and a passive matrix type according to a driving method, any driving method may be employed in the present invention.

The transparent electrode in the organic EL display device of the present invention refers to an electrode having a light transmittance of 30% or more at a wavelength of 550 nm, and the non-transparent electrode refers to an electrode having a light transmittance of less than 30% at a wavelength of 550 nm. Here, the light transmittance in the present invention can be measured with a spectrophotometer for an electrode formed on a transparent glass substrate.

In the organic EL display device of the present invention, the transparent electrode and the non-transparent electrode are combined as the first electrode and the second electrode describe above, whereby light emission in the organic EL layer 4 can be extracted to one side. The transparent electrode and the non-transparent electrode in the present invention are required to have such composite characteristics that electric characteristics are excellent, that holes can be efficiently injected when these electrodes are used as anodes, and that electrons can be efficiently injected when these electrodes are used as cathodes.

Examples of a material for forming the transparent electrode in the present invention include transparent electric conductive oxide and metal. When the transparent electrode is used as an anode, ITO, IZO, AZO, GZO, ATO, or the like is preferably used, and when the transparent electrode is used as a cathode, Li, Mg, Ag, Al, or the like is preferably used.

The reflectance of the non-transparent electrode in the present invention is preferably 80% or less. Here, the reflectance of the non-transparent electrode in the present invention refers to a reflectance at a wavelength of 550 nm and the reflectance of an electrode formed on a transparent glass substrate can be measured with a spectrophotometer. When the reflectance of the non-transparent electrode is more than 80%, although light emission in the organic EL layer can be efficiently extracted, the contrast is reduced by an increase in external light reflection, or color shift due to diffusion of light to adjacent pixels tends to occur. The reflectance of the non-transparent electrode is more preferably 45% or less and further preferably 30% or less. Furthermore, from the viewpoint of luminance, the reflectance of the non-transparent electrode is preferably 5% or more and more preferably 10% or more, to avoid too small reflectance of the non-transparent electrode.

Examples of a material for forming the non-transparent electrode in the present invention include carbon and metal. In particular, the non-transparent electrode is preferably mainly composed of Ag, Al, C, Cr, Cu, Mo, Ni, or Ti, and it is possible to improve corrosion resistance of the non-transparent electrode and improve reliability of the organic EL display device. The non-transparent electrode is more preferably mainly composed of Ag, Al, or. Cu. Here, the term "main component" in the present invention refers to the most abundant component in the material for forming the non-transparent electrode. Examples of an electrode material containing the components include alloys such as AgIn alloy, AgZn alloy, AgZnBi alloy, Al graphene alloy, AlMn alloy, AlNd alloy, AlGaNi alloy, CuZn alloy, and CuZnMg alloy, Ag nanofiller (wire), and Ag nanoparticles.

It is also preferable that the non-transparent electrode have a multilayer structure in order to simultaneously achieve composite characteristics. For example, the non-transparent electrode may be formed as a multilayer structure, and an underlying layer for improving adhesiveness and corrosion resistance or a reflection adjustment layer for adjusting the reflectance may be provided on the substrate side. Furthermore, it is also preferable that a work function difference at an interface with an organic EL layer be adjusted by forming the non-transparent electrode as a multilayer structure and stacking a transparent electric conductive oxide material on the outermost surface layer on the organic EL layer side. ITO, IZO, AZO, GZO, ATO, and the like are preferably used as the transparent electric conductive oxide material because of high transmittance and low resistivity.

Examples of the configuration of the organic EL layer in the organic EL display device of the present invention include (1) hole transporting layer/light emitting layer, (2) hole transporting layer/light emitting layer/electron transporting layer, and (3) light emitting layer/electron transporting layer. Various investigations have been made on the configuration of the organic EL layer in order to comprehensively improve injection and transport of holes and electrons, light emission efficiency in a light emitting layer, and the like, and as an example of a preferable embodiment, an organic thin film EL element described in Japanese Laid-open Patent Publication No. 8-109373 can be mentioned.

The organic EL display device of the present invention includes a black insulating layer. The provision of the black insulating layer can suppress external light reflection from the non-transparent electrode and improve contrast. In addition, it is possible to suppress diffusion of reflected external light and emitted light in the organic EL layer to adjacent pixels and reduce color shift. Here, the black insulating layer in the present invention refers to the fact that an optical density (OD value) of the insulating layer in a visible wavelength range of 380 to 700 nm is 0.3 or more per 1.0 μm of film thickness. The OD value per 1.0 μm of film thickness is more preferably 0.8 or more and further preferably 1.0 or more. The OD value of the insulating layer can be obtained from the following relational expression (1) by measuring the intensity of light incident on the insulating layer and the intensity of light transmitted through the insulating layer using a microspectroscope (MCPD 2000, manufactured by Otsuka Electronics Co., Ltd.). The obtained OD value is divided by the film thickness (μm) of the insulating layer, whereby the OD value per 1.0 μm of film thickness can be calculated.

$$\text{OD value} = \log_{10}(I_0/I) \quad (1)$$

$I_0$; incident light intensity, I; transmitted light intensity

As the insulating layer, a cured film of a photosensitive resin composition is preferred. In the present invention, a cured film may be simply referred to as a film. The photosensitive resin composition preferably contains (C) a coloring material, more preferably contains (A) an alkali-soluble resin, (B) a photosensitive agent, and (C) the coloring material, and further preferably contains (D) an organic solvent in addition to (A) to (C). When the photosensitive resin composition contains (C) the coloring material, the insulating layer can be blackened. When (A) the alkali-soluble resin and (B) the photosensitive agent are combined and contained as the photosensitive resin composition, pattern processing using photosensitivity becomes possible. When (D) the organic solvent is contained, the photosensitive resin composition can be put into a varnish state, and coating properties can be improved in some cases. The photosensitive resin composition may further contain another component.

If an insulating layer opening ratio in a display area of the organic EL display device is reduced, load on the organic EL layer is increased. Thus, the insulating layer opening ratio in the display area is preferably 5% or more and more preferably 10% or more in terms of reliability. As the insulating layer opening ratio in the display area increases, the reflectance at the time of non-lighting becomes higher. Thus, the insulating layer opening ratio in the display area is preferably 35% or less and more preferably 30% or less in terms of contrast.

<(A) Alkali-Soluble Resin>

The alkali solubility in the present invention refers to a matter that, when a solution prepared by dissolving the resin in γ-butyrolactone is applied on a silicon wafer, then the silicon wafer is prebaked at 120° C. for 4 minutes to form a prebaked film having a film thickness of 10 μm±0.5 μm, then the prebaked film is immersed in a 2.38% by weight aqueous tetramethylammonium hydroxide solution at 23±1° C. for 1 minute, and then the immersed film is rinsed with pure water, a dissolution rate that is determined from the amount of decrease in film thickness is 50 nm/min. or more.

(A) The alkali-soluble resin preferably has an aromatic carboxylic acid structure, from the viewpoint of the improvement in heat resistance. The aromatic carboxylic acid structure in the present invention refers to a carboxylic acid structure that is directly bonded to an aromatic ring by a covalent bond.

Examples of (A) the alkali-soluble resin include a polyimide, a polyimide precursor, a polybenzoxazole, a polybenzoxazole precursor, a polysiloxane, an acrylic resin, and a cardo resin. Two or more of these resins may be contained together. Among these resins, the polyimide precursor being excellent in heat resistance and a smaller outgassing rate at a high temperature is preferred. Furthermore, a polyimide precursor having an amide acid structure is more preferred from the viewpoint of the improvement in alkali solubility.

<(B) Photosensitive Agent>

When a positive type photosensitivity is imparted to the photosensitive resin composition in the present invention, examples of (B) the photosensitive agent include (b1) an o-quinone diazide compound. On the other hand, when a negative type photosensitivity is imparted to the photosensitive resin composition in the present invention, examples of (B) the photosensitive agent include (b2) a photoinitiator. A negative type photosensitive resin composition preferably further contains (G) a radical-polymerizable compound to be described later.

As the (b1) o-quinone diazide compound, a compound in which sulfonic acid of naphthoquinone diazide sulfonic acid is ester-bonded to a compound having a phenolic hydroxy group is preferred. Examples of the compound having the phenolic hydroxy group include Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylene tris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP (trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, TM-BIP-A (trade names, manufactured by ASAHI YUKIZAI CORPORATION), 2,6-dimethoxymethyl-4-tert-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylenebisphenol, and BisP-AP (trade names, manufactured by Honshu Chemical Industry Co., Ltd.). Examples of the naphthoquinone diazide sulfonic acid include 4-naphthoquinone diazide sulfonic acid and 5-naphthoquinone diazide sulfonic acid. When (b1) the o-quinone diazide compound as described above is contained, the resolution, sensitivity, and residual layer thickness of the photosensitive resin composition can be improved.

A 4-naphthoquinone diazide sulfonyl ester compound has absorption in the i-line region of a mercury lamp, and is therefore suitable for the exposure to i-line. A 5-naphthoquinone diazide sulfonyl ester compound has absorption in a region extending to the g-line region of a mercury lamp, and is therefore suitable for exposure to g-line. It is preferred to select either one of a 4-naphthoquinone diazide sulfonyl ester compound and a 5-naphthoquinone diazide sulfonyl ester compound depending on the wavelength to be employed for the exposure. A naphthoquinone diazide sulfonyl ester compound having a 4-naphthoquinone diazide sulfonyl group and a 5-naphthoquinone diazide sulfonyl group in the molecule may be used, or both a 4-naphthoquinone diazide sulfonyl ester compound and a 5-naphthoquinone diazide sulfonyl ester compound may be used.

The naphthoquinone diazide compound can be synthesized by an esterification reaction of a compound having a phenolic hydroxy group with a quinone diazide sulfonic acid compound.

The content of (b1) the o-quinone diazide compound in the positive type photosensitive resin composition is preferably 6% by weight or more and 20% by weight or less based on 100% by weight of the total solid content of the positive type photosensitive resin composition, and sensitivity and pattern processability can be improved.

(b2) The photoinitiator is a compound that generates radicals as a result of bond cleavage and/or a reaction when exposed to light. Examples of (b2) the photoinitiator include benzyl ketal based photoinitiator, α-hydroxyketone based photoinitiator, α-aminoketone based photoinitiator, acylphosphine oxide based photoinitiator, oxime ester based photoinitiator, acridine based photoinitiator, titanocene based photoinitiator, benzophenone based photoinitiator, acetophenone based photoinitiator, aromatic keto ester based photoinitiator, and benzoic acid ester based photoinitiator. Two or more of these photoinitiators may be contained together. From the viewpoint of the improvement in sensitivity, as (b2) the photoinitiator, α-hydroxyketone based photoinitiator, α-aminoketone based photoinitiator, acylphosphine oxide based photoinitiator, oxime ester based photoinitiator, acridine based photoinitiator, and benzophenone based photoinitiator are more preferred, and α-aminoketone based photoinitiator, acylphosphine oxide based photoinitiator, and oxime ester based photoinitiator are still more preferred.

Examples of the benzyl ketal based photoinitiator include 2,2-dimethoxy-1,2-diphenyl ethan-1-one.

Examples of the α-hydroxyketone based photoinitiator include 1-(4-isopropylphenyl)-2-hydroxy-2-methylpropan-1-one, 2-hydroxy-2-methyl-1-phenylpropan-1-one, 1-hydroxycyclohexyl phenyl ketone, 1-[4-(2-hydroxyethoxy)phenyl]-2-hydroxy-2-methylpropan-1-one, and 2-hydroxy-1-[4-[4-(2-hydroxy-2-methylpropionyl)benzyl] phenyl]-2-methylpropan-1-one.

Examples of the α-aminoketone based photoinitiator include 2-methyl-1-[4-(methylthio)phenyl]-2-morpholino-propan-1-one, 2-benzyl-2-dimethylamino-1-(4-morpholinophenyl)-butan-1-one, 2-dimethylamino-2-(4-methylbenzyl)-1-(4-morpholinophenyl)-butan-1-one, and 3,6-bis(2-methyl-2-morpholinopropionyl)-9-octyl-9H-carbazole.

Examples of the acylphosphine oxide based photoinitiator include 2,4,6-trimethylbenzoyl-diphenylphosphine oxide, bis(2,4,6-trimethylbenzoyl)-phenylphosphine oxide, and bis(2,6-dimethoxybenzoyl)-(2,4,4-trimethylpentyl) phosphine oxide.

Examples of the oxime ester based photoinitiator include 1-phenylpropan-1,2-dione-2-(O-ethoxycarbonyl)oxime, 1-phenylbutan-1,2-dione-2-(O-methoxycarbonyl)oxime, 1,3-diphenylpropan-1,2,3-trione-2-(O-ethoxycarbonyl)oxime, 1-[4-(phenylthio)phenyl]octan-1,2-dione-2-(O-benzoyl)oxime, 1-[4-[4-(carboxyphenyl)thio]phenyl]propan-1,2-dione-2-(O-acetyl)oxime, 1-[9-ethyl-6-(2-methylbenzoyl)-9H-carbazol-3-yl]ethanone-1-(O-acetyl)oxime, 1-[9-ethyl-6-[2-methyl-4-[1-(2,2-dimethyl-1,3-dioxolan-4-yl)methyloxy]benzoyl]-9H-carbazol-3-yl]ethanone-1-(O-acetyl)oxime, and "ADEKA ARKLS" (a registered trademark) NCI-831 (manufactured by ADEKA Corporation).

Examples of the acridine based photoinitiator include 1,7-bis(acridin-9-yl)-n-heptane.

Examples of the titanocene based photoinitiator include bis(η5-2,4-cyclopentadien-1-yl)-bis[2,6-difluoro)-3-(1H-pyrrol-1-yl)phenyl]titanium (IV) and bis(η5-3-methyl-2,4-cyclopentadien-1-yl)-bis(2,6-difluorophenyl)titanium (IV).

Examples of the benzophenone based photoinitiator include benzophenone, 4,4'-bis(dimethylamino)benzophenone, 4,4'-bis(diethylamino)benzophenone, 4-phenylbenzophenone, 4,4-dichlorobenzophenone, 4-hydroxybenzophenone, alkylated benzophenone, 3,3',4,4'-tetrakis(t-butylperoxycarbonyl)benzophenone, 4-methylbenzophenone, dibenzyl ketone, and fluorenone.

Examples of the acetophenone based photoinitiator include 2,2-diethoxyacetophenone, 2,3-diethoxyacetophenone, 4-t-butyldichloroacetophenone, benzalacetophenone, and 4-azidobenzalacetophenone.

Examples of the aromatic keto ester based photoinitiator include methyl 2-phenyl-2-oxyacetate.

Examples of the benzoic acid ester based photoinitiator include ethyl 4-(dimethylamino)benzoate, (2-ethyl)hexyl 4-(dimethylamino)benzoate, ethyl 4-(diethylamino)benzoate, and methyl 2-benzoylbenzoate.

The content of (b2) the photoinitiator in the negative type photosensitive resin composition is preferably 1 part by weight or more based on 100 parts by weight of the combination of (A) the alkali-soluble resin and (G) the radical-polymerizable compound to be described later from the viewpoint of sensitivity and is preferably 15 parts by weight or less based on 100 parts by weight of the combination of (A) the alkali-soluble resin and (G) the radical-polymerizable compound to be described later from the viewpoint of resolution and tapered shape.

<(C) Coloring Material>

(C) The coloring material in the present invention is a compound that absorbs light in a specific wavelength range and, in particular, (C) the coloring material is preferably a compound that acts to color a material when absorbing light in the visible wavelength range (380 to 780 nm). When (C) the coloring material is contained, an insulating layer can be colored, and, as a result, it becomes possible to impart a coloring property to allow light penetrating the insulating layer or light reflected by the insulating layer to have a desired color. It also serves to impart light blocking capability to block the light of a wavelength that (C) the coloring material absorbs from light penetrating the insulating layer or light reflected by the insulating layer. As a result, the optical density of the insulating layer in the visible region with a wavelength of 380 to 700 nm can be within the above-mentioned range.

(C) The coloring material may be a compound that absorbs light in a visible wavelength range to produce a color such as white, red, orange, yellow, green, blue, and violet. Two or more of such coloring materials may be used in combination to ensure an improved toning capability so that the color coordinates of light penetrating the insulating layer or light reflected by the insulating layer can be adjusted as desired.

(C) The coloring material preferably contains (C1) a pigment and/or (C2) a dye. Furthermore, (C) the coloring material preferably contains (Ca) a black coloring agent and/or (Cb) a non-black coloring agent. The incorporation of (Ca) the black coloring agent and/or (Cb) the non-black coloring agent serves to impart the light blocking capability to the insulating layer and facilitate adjustment of a color in a color system. As an embodiment relating to the incorporation of (C1) the pigment in (C) the coloring material, it is preferable that (C1) the pigment be contained as (Ca) the black coloring agent and/or (Cb) the non-black coloring agent, and as an embodiment relating to the incorporation of (C2) the dye in (C) the coloring material, it is preferable that (C2) the dye be contained as (Ca) the black coloring agent and/or (Cb) the non-black coloring agent.

(Ca) The black coloring agent is a compound that acts to color a material black by absorbing light in the visible wavelength range. When (Ca) the black coloring agent is contained, the insulating layer can be blackened, and transmitted light through the insulating layer and reflected light from the insulating layer are blocked, so that the light blocking capability can be improved.

From the viewpoint of light blocking capability, (Ca) the black coloring agent is preferably a compound that can color a material black by absorbing light over the entire visible wavelength range. It is also preferable for (C) the coloring material to be a mixture of two or more selected from coloring materials of white, red, orange, yellow, green, blue, and violet. A combination of two or more of these coloring materials can act to color a material pseudo-black to ensure an improved light blocking capability.

(Cb) The non-black coloring agent is a compound that acts to color a material by absorbing light in the visible wavelength range. Examples thereof include coloring agents that serve for coloring a material in non-black colors including white, red, orange, yellow, green, blue, and violet, as described above.

<(C1) Pigment>

(C1) The pigment is a compound that colors a material by physical adsorption of (C1) the pigment on the surface of the material or interaction of (C1) the pigment with the surface of the material, and it is insoluble in most solvents and the like. The coloration by (C1) the pigment is high in hiding power and does not easily fade in color due to ultraviolet ray or the like, and therefore, when (C1) the pigment is contained, the insulating layer can be colored in a color with high hiding power, and the light blocking capability and weather resistance of the insulating layer can be improved.

The number average particle diameter of (C1) the pigment in the photosensitive resin composition is preferably 1 nm or more, more preferably 5 nm or more, and still more preferably 10 nm or more from the viewpoint of dispersion stability. On the other hand, the number average particle diameter of (C1) the pigment in the photosensitive resin composition is preferably 1,000 nm or less, more preferably 500 nm or less, and still more preferably 200 nm from the viewpoint of pattern processability. Here, the number average particle diameter of (C1) the pigment can be determined from laser scattering attributed to the Brownian movement of (C1) the pigment in a photosensitive resin composition (dynamic light scattering method) that is measured with a submicronic particle size distribution measuring apparatus (N4-PLUS, manufactured by Beckman Coulter K.K.) or a zeta potential/particle diameter/molecular weight measuring apparatus (Zetasizer Nano ZS, manufactured by Sysmex Corporation).

Examples of (C1) the pigment include organic pigments and inorganic pigments. The organic pigments are preferred, and the transmission spectrum or absorption spectrum of the insulating layer can be easily adjusted to a desired range by achieving transmission or blockage of light in an intended specific wavelength range, or the like, through chemical structure change or functional transformation. As the organic pigments, for example, anthraquinone based pigments, quinacridone based pigments, pyranthrone based pigments, diketopyrrolopyrrole based pigments, benzofuranone based pigments, perylene based pigments, condensed azo based pigments, carbon black, and the like are preferable.

<(C2) Dye>

(C2) The dye is a compound that colors a material as a result of chemical adsorption or strong interaction of a substituent group such as an ionic group or hydroxy group in (C2) the dye on or with the surface structure of the material, and it is soluble in most solvents and the like. In the coloring by (C2) the dye, individual molecules are adsorbed on the material, leading to a high coloring power and a high color development efficiency, and therefore, the color in the color system of the insulating layer can be easily adjusted by containing (C2) the dye.

Examples of (C2) the dye include direct dye, reactive dye, sulfur dye, vat dye, sulfur dye, acid dye, metal complex dye, metal complex acid dye, basic dye, mordant dye, acid mordant dye, disperse dye, cationic dye, and fluorescent whitening dye. Two or more of these dyes may be contained together.

Examples of (C2) the dye include anthraquinone based dye, azo based dye, azine based dye, phthalocyanine based dye, methine based dye, oxazine based dye, quinoline based dye, indigo based dye, indigoid based dye, carbonium based dye, threne based dye, perinone based dye, perylene based dye, triarylmethane based dye, and xanthene based dye. From the viewpoint of the solubility in (D) the organic solvent and heat resistance, anthraquinone based dye, azo based dye, azine based dye, methine based dye, triarylmethane based dye, and xanthene based dye are preferred.

The content of (C) the coloring material in the photosensitive resin composition to be used in the present invention is preferably 15 parts by weight or more, more preferably 20 parts by weight or more, further preferably 25 parts by weight or more, and yet further preferably 30 parts by weight or more based on 100 parts by weight of the combination of (A) the alkali-soluble resin, (C) the coloring material, and a dispersant to be described later, from the viewpoint of light blocking capability, coloring property, and toning capability. On the other hand, the content of (C) the coloring material is preferably 80 parts by weight or less, more preferably 75 parts by weight or less, further preferably 70 parts by weight or less, and yet further preferably 65 parts by weight or less from the viewpoint of sensitivity. The content of (C) the coloring material in the solid content of the photosensitive resin composition is preferably 5% by weight or more, more preferably 10% by weight or more, and further preferably 15% by weight or more from the viewpoint of light blocking capability, coloring property, and toning capability. On the other hand, the content of (C) the coloring material in the solid content of the photosensitive resin composition is preferably 70% by weight or less, more preferably 65% by weight or less, and further preferably 60% by weight or less from the viewpoint of sensitivity.

The content of (C1) the pigment in the solid content of the photosensitive resin composition is preferably 5% by weight or more, more preferably 10% by weight or more, and further preferably 15% by weight or more from the viewpoint of light blocking capability, coloring property, and toning capability. On the other hand, the content of (C1) the pigment in the solid content of the photosensitive resin composition is preferably 70% by weight or less, more preferably 65% by weight or less, and further preferably 60% by weight or less from the viewpoint of sensitivity.

The content of (C2) the dye in the solid content of the photosensitive resin composition is preferably 0.01% by weight or more, more preferably 0.05% by weight or more, and further preferably 0.1% by weight or more from the viewpoint of coloring property and toning capability. On the other hand, the content of (C2) the dye in the solid content of the photosensitive resin composition is preferably 50% by weight or less, more preferably 45% by weight or less, and further preferably 40% by weight or less from the viewpoint of the heat resistance of the insulating layer.

<(D) Organic Solvent>

Examples of (D) the organic solvent include: a polar aprotic solvent such as γ-butyrolactone; an ether such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tetrahydrofuran, and dioxane; a ketone such as acetone, methyl ethyl ketone, diisobutyl ketone, cyclohexanone, 2-heptanone, 3-heptanone, and diacetone alcohol; an ester such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, and ethyl lactate; another ester such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxybutyl acetate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl acetate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanoate; an aromatic hydrocarbon such as toluene and xylene; and an amide such as N-methylpyrrolidone, N,N-dimethylformamide, and N,N-dimethylacetamide. Two or more of these organic solvents may be contained together.

The content of (D) the organic solvent in the photosensitive resin composition may be selected appropriately to suite the coating method to be used and the like. For example, a content in the range of 50 to 95% by weight of the total quantity of the photosensitive resin composition is commonly adopted when the spin coating technique is used to perform coating.

<(E) Thermally Crosslinking Agent>

The photosensitive resin composition to be used in the present invention can contain (E) a thermally crosslinking agent. The thermally crosslinking agent is a compound having at least two thermally reactive functional groups in the molecule. Examples of the thermally reactive functional group include an alkoxymethyl group, a methylol group, an epoxy group, and an oxetanyl group. Two or more of these functional groups may be contained together. When (E) the thermally crosslinking agent is contained, (A) the alkali-soluble resin and other additive components are crosslinked, and the heat resistance, chemical resistance, and hardness of a cured film can be improved. In addition, it is possible to reduce the volume of an out-gas generated from the cured film and improve the reliability of the organic EL display device.

Examples of thermally crosslinking agents having alkoxymethyl groups or methylol groups as thermally reactive functional groups include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (product names, manufactured by Honshu Chemical Industry Co., Ltd.), and "NIKALAC (a registered trademark)" MX-290, "NIKALAC" MX-280, "NIKALAC" MX-270, "NIKALAC" MX-279, "NIKALAC" MW-100LM, and "NIKALAC" MX-750LM (product names, manufactured by Sanwa Chemical Co., Ltd.).

Examples of thermally crosslinking agents having epoxy groups as thermally reactive functional groups include: Epolight 40E, Epolight 100E, Epolight 200E, Epolight 400E, Epolight 70P, Epolight 200P, Epolight 400P, Epolight 1500NP, Epolight 80MF, Epolight 4000, and Epolight 3002 (manufactured by Kyoeisha Chemical Co., Ltd.); "Denacol" (a registered trademark) EX-212L, "Denacol" EX-214L, "Denacol" EX-216L, "Denacol" EX-850L, and "Denacol" EX-321L (manufactured by Nagase ChemteX Corporation); GAN and GOT (manufactured by Nippon Kayaku Co., Ltd.); "Epikote (a registered trademark)" 828, "Epikote" 1002, "Epikote" 1750, "Epikote" 1007, YX8100-BH30, E1256, E4250, and E4275 (manufactured by Japan Epoxy Resins Co., Ltd.); "Epiclon (a registered trademark)" EXA-9583 and HP4032 (manufactured by Dainippon Ink and Chemicals, Inc.), VG3101 (manufactured by Mitsui Chemicals, Inc.), "Tepic (a registered trademark)" S, "Tepic" G, and "Tepic" P (manufactured by Nissan Chemical Industries, Ltd.); NC6000 (manufactured by Nippon Kayaku Co., Ltd.); Epotohto (a registered trademark) YH-434L (manufactured by Tohto Kasei Co., Ltd.); EPPN502H and NC3000 (manufactured by Nippon Kayaku Co., Ltd.); and Epiclon N695 and HP7200 (manufactured by Dainippon Ink and Chemicals, Inc.).

Examples of thermally crosslinking agents having oxetanyl groups as thermally reactive functional groups include: "Eternacoll (a registered trademark)" EHO, "Eternacoll" OXBP, "Eternacoll" OXTP, and "Eternacoll" OXMA (manufactured by Ube Industries, Ltd.); and oxetanized phenol novolac.

The content of the thermally crosslinking agent is not particularly limited, but, for example, in the positive type photosensitive resin composition, the content of the thermally crosslinking agent is preferably 1% by weight or more and 30% by weight or less in the solid content of the photosensitive resin composition. On the other hand, in the negative type photosensitive resin composition, the content of the thermally crosslinking agent is preferably 0.1 parts by weight or more and 70 parts by weight or less based on 100 parts by weight of the combination of (A) the alkali-soluble resin and (G) the radical-polymerizable compound. If the content of the thermally crosslinking agent is within the above-mentioned range, the hardness and chemical resistance of the insulating layer can be improved.

<(F) Dispersant>

It is preferred that the photosensitive resin composition to be used in the present invention additionally contain (F) a dispersant. (F) The dispersant is a compound which has a surface-affinity group that interacts with the surface of a disperse dye or the like which serves as (C1) the pigment or (C2) the dye mentioned above and also has a dispersion-stabilizing structure for improving the dispersion stability of (C1) the pigment or the disperse dye. Examples of the dispersion-stabilizing structure of (F) the dispersant include a polymer chain and a substituent having a static electric charge, and (F) the dispersant is expected to cause steric hindrance or electrostatic repulsion to exhibit a dispersion effect.

When (F) the dispersant is contained, in a case where the photosensitive resin composition contains (C1) the pigment or the disperse dye, the dispersion stability of (C1) the pigment or the disperse dye can be improved and, consequently, the resolution can be improved. Particularly in the case where (C1) the pigment is composed of ground particles having a number average particle diameter of 1 μm or less, the surface areas of the particles of (C1) the pigment increase and, consequently, the aggregation of the particles of (C1) the pigment is likely to occur. On the other hand, in the case where (C1) the pigment is contained, the aggregation of the particles of (C1) the pigment can be prevented and the dispersion stability of the particles can be improved as the result of the interaction between the surface of (C1) the pigment ground and the surface-affinity group in (F) the dispersant and the steric hindrance and/or the electrostatic repulsion associated with the dispersion-stabilizing structure of (F) the dispersant.

Examples of (F) the dispersant include a dispersant having an amine value of 5 mg KOH/g or more, a dispersant having an acid value of 5 mg KOH/g or more, a dispersant having an amine value and an acid value of 5 mg KOH/g or more, and a dispersant having an amine value and an acid value of less than 5 mg KOH/g. From the viewpoint of the improvement in dispersion stability of the particles of (C1) the pigment, the dispersant having an amine value of 5 mg KOH/g or more is preferred.

The amine value of (F) the dispersant is preferably 5 mg KOH/g or more, more preferably 8 mg KOH/g or more, and further preferably 10 mg KOH/g or more from the viewpoint of the dispersion stability of (C1) the pigment. On the other hand, the amine value of (F) the dispersant is preferably 150 mg KOH/g or less, more preferably 120 mg KOH/g or less, and further preferably 100 mg KOH/g or less from the viewpoint of the storage stability of the photosensitive resin composition.

The amine value as used herein refers to the weight of potassium hydroxide which is equivalent to the quantity of an acid that reacts with 1 g of (F) the dispersant, and is expressed in a unit "mg KOH/g". The amine value can be determined by neutralizing 1 g of (F) the dispersant with an acid and then titrating with an aqueous potassium hydroxide solution. The amine equivalent (unit: g/mol), which is the weight per 1 mol of amino groups, can be calculated from the amine value, and the number of amino groups in (F) the dispersant can be determined.

The acid value of (F) the dispersant is preferably 5 mg KOH/g or more, more preferably 8 mg KOH/g or more, and further preferably 10 mg KOH/g or more from the viewpoint of the dispersion stability of (C1) the pigment. On the other hand, the acid value of (F) the dispersant is preferably 200 mg KOH/g or less, more preferably 170 mg KOH/g or less, and further preferably 150 mg KOH/g or less from the viewpoint of the storage stability of the photosensitive resin composition.

The acid value as used herein refers to the weight of potassium hydroxide which reacts with 1 g of (F) the dispersant, and is expressed in a unit "mg KOH/g". The acid value can be determined by titrating 1 g of (F) the dispersant with an aqueous potassium hydroxide solution. The acid equivalent (unit: g/mol), which is the weight per 1 mol of acidic groups, can be calculated from the acid value, and the number of acidic groups in (F) the dispersant can be determined.

(F) The dispersant preferably has a such structure that the amino group and/or the acidic group that serves as the surface-affinity group forms a salt with an acid and/or a base.

Examples of the dispersant having an amine value of 5 mg KOH/g or more and an acid value of 0 mg KOH/g include "DISPERBYK (a registered trademark)"-108, -109, -160, -161, -162, -163, -164, -166, -167, -168, -182, -184, -185, -2000, -2008, -2009, -2022, -2050, -2055, -2150, -2155, -2163, -2164, and -2061, "BYK (a registered trademark)"- 9075, -9077, -LP-N6919, -LP-N21116, and -LP-N21324, (manufactured by BYK Japan KK), "EFKA (a registered trademark)" 4015, 4020, 4046, 4047, 4050, 4055, 4060, 4080, 4300, 4330, 4340, 4400, 4401, 4402, 4403, and 4800 (manufactured by BASF SE), "AJISPER (a registered trademark)" PB711 (manufactured by Ajinomoto Fine-Techno Co., Inc.), and "SOLSPERSE (a registered trademark)" 13240, 13940, 20000, 71000, and 76500 (manufactured by The Lubrizol Corporation).

Examples of the dispersant having an amine value and an acid value of 5 mg KOH/g or more include "ANTI-TERRA (a registered trademark)"-U100 and -204, "DISPERBYK (a registered trademark)"-106, -140, -142, -145, -180, -2001, -2013, -2020, -2025, -187, and -191, "BYK (a registered trademark)"-9076 (manufactured by BYK Japan KK), "AJISPER (a registered trademark)" PB821, PB880, and PB881 (manufactured by Ajinomoto Fine-Techno Co., Inc.), and "SOLSPERSE (a registered trademark)" 9000, 11200, 13650, 24000, 32000, 32500, 32500, 32600, 33000, 34750, 35100, 35200, 37500, 39000, 56000, and 76500 (manufactured by The Lubrizol Corporation).

Examples of the dispersant having an amine value of 0 mg KOH/g and an acid value of 5 mg KOH/g or more include "DISPERBYK (a registered trademark)"-102, -110, -111, -118, -170, -171, -174, -2060, and -2096, "BYK (a registered trademark)"-P104, -P105, and -220S (manufactured by BYK Japan KK), and "SOLSPERSE (a registered trademark)" 3000, 16000, 17000, 18000, 21000, 26000, 28000, 36000, 36600, 38500, 41000, 41090, 53095, and 55000 (manufactured by The Lubrizol Corporation).

Examples of (F) the dispersant having an amine value and an acid value of 0 mg KOH/g include "DISPERBYK (a registered trademark)"-103, -2152, -2200, and -192 (manufactured by BYK Japan KK), and "SOLSPERSE (a registered trademark)" 27000, 54000, and X300 (manufactured by The Lubrizol Corporation).

(F) The dispersant may be a dispersant having a polymer chain. Examples of the dispersant having a polymer chain include an acrylic resin-type dispersant, a polyoxyalkylene ether-type dispersant, a polyester-type dispersant, a polyurethane-type dispersant, a polyol-type dispersant, a polyethylene imine-type dispersant, and a polyallylamine-type dispersant. From the viewpoint of the pattern processability with an alkaline developing solution, an acrylic resin-type dispersant, a polyoxyalkylene ether-type dispersant, a polyester-type dispersant, a polyurethane-type dispersant, and a polyol-type dispersant are preferred.

In the case where the negative type photosensitive resin composition to be used in the present invention contains a disperse dye as (C1) the pigment and/or (C2) the dye, the content of (F) the dispersant in the negative type photosensitive resin composition to be used in the present invention is preferably 1 part by weight or more, more preferably 5 parts by weight or more, and further preferably 10 parts by weight or more based on 100 parts by weight of the combination of (C1) the pigment, the disperse dye in (C2) the dye, and (F) the dispersant from the viewpoint of dispersion stability and resolution. On the other hand, the content of (F) the dispersant is preferably 60 parts by weight or less, more preferably 55 parts by weight or less, and further preferably 50 parts by weight or less from the viewpoint of the heat resistance of the insulating layer.

<(G) Radical-Polymerizable Compound>

In the present invention, (G) the radical-polymerizable compound is a compound that has two or more ethylenically unsaturated double bond groups in the molecule. When (G) the radical-polymerizable compound is contained, UV curing upon exposure to light is accelerated to ensure an improved sensitivity. In addition, the crosslink density after thermal curing can be increased, leading to the insulating layer with an improved hardness.

(G) The radical-polymerizable compound is preferably a compound having a (meth)acrylic group, because the radical polymerization of the compound can proceed readily. From the viewpoint of the improvement in sensitivity upon exposure to light and the improvement in the hardness of a cured film, a compound having two or more (meth)acrylic groups in the molecule is more preferred. The double bond equivalent in (G) the radical-polymerizable compound is preferably 80 to 400 g/mol, from the viewpoint of the improvement in the sensitivity upon exposure to light and the improvement in the hardness of the cured film.

Examples of (G) the radical-polymerizable compound include diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane di(meth)acrylate, ethoxylated trimethylolpropane tri(meth)acrylate, ditrimethylolpropane tri(meth)acrylate, ditrimethylolpropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, dimethylol-tricyclodecane di(meth)acrylate, ethoxylated glycerin tri(meth)acrylate, pentaerythritol tri(meth)acrylate, pentaerythritol tetra(meth)acrylate, ethoxylated pentaerythritol tri(meth)acrylate, ethoxylated pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, tetrapentaerythritol nona(meth)acrylate, tetrapentaerythritol deca(meth)acrylate, pentapentaerythritol undeca(meth)acrylate, pentapentaerythritol dodeca(meth)acrylate, ethoxylated bisphenol A di(meth)acrylate, 2,2-bis[4-(3-(meth)acryloxy-2-hydroxypropoxy)phenyl]propane, 1,3,5-tris((meth)acryloxyethyl)isocyanuric acid, 1,3-bis((meth)acryloxyethyl)isocyanuric acid, 9,9-bis[4-(2-(meth)acryloxyethoxy)phenyl]fluorene, 9,9-bis[4-(3-(meth)acryloxypropoxy)phenyl]fluorene, and 9,9-bis(4-(meth)acryloxyphenyl)fluorene, and acid-modified products, ethylene oxide-modified products, and propylene oxide-modified products thereof. Two or more thereof may be contained together. From the viewpoint of the improvement in the sensitivity upon exposure to light and the improvement in the hardness of the cured film, (G) the radical-polymerizable compound is preferably trimethylolpropane tri(meth)acrylate, ditrimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, 2,2-bis[4-(3-(meth)acryloxy-2-hydroxypropoxy)phenyl]propane, 1,3,5-tris((meth)acryloxyethyl)isocyanuric acid, 1,3-bis((meth)acryloxyethyl)isocyanuric acid, 9,9-bis[4-(2-(meth)acryloxyethoxy)phenyl]fluorene, 9,9-bis[4-(3-(meth)acryloxypropoxy)phenyl]fluorene, or 9,9-bis(4-(meth)acryloxyphenyl)fluorene, or an acid-modified product, an ethylene oxide-modified product, or a propylene oxide-modified product thereof. From the viewpoint of the improvement in resolution after development, the acid-modified products and the ethylene oxide-modified products are more preferred. From the viewpoint of the improvement in resolution after development, (G) the radical-polymerizable compound is also preferably a compound which is produced by reacting a ring-opening adduct of a compound having two or more glycidoxy groups in the molecule with an unsaturated carboxylic acid having an ethylenically unsaturated double bond group, with a polybasic carboxylic acid or a polybasic carboxylic anhydride.

The content of (G) the radical-polymerizable compound in the negative type photosensitive resin composition to be used in the present invention is preferably 15 parts by weight or more, more preferably 20 parts by weight or more, further preferably 25 parts by weight or more, and yet further preferably 30 parts by weight or more based on 100 parts by weight of the total content of (A) the alkali-soluble resin and (G) the radical-polymerizable compound from the viewpoint of sensitivity and pattern form. On the other hand, the content of (G) the radical-polymerizable compound is preferably 65 parts by weight or less, more preferably 60 parts by weight or less, further preferably 55 parts by weight or less, and yet further preferably 50 parts by weight or less from the viewpoint of the heat resistance of the insulating layer.

<Other Component—Adhesion Improving Agent>

The photosensitive resin composition to be used in the present invention may contain an adhesion improving agent. When the adhesion improving agent is contained, it becomes possible to increase the adhesion of a photosensitive resin composition film onto an underlying substrate such as a silicon wafer, ITO, $SiO_2$, or silicon nitride. Furthermore, it becomes also possible to improve the resistance to oxygen plasma, which is used for washing purposes, or a UV ozone treatment. Examples of the adhesion improving agent include: a silane coupling agent such as vinyltrimethoxysilane, vinyltriethoxysilane, epoxycyclohexylethyltrimethoxysilane, 3-glycidoxypropyltrimethoxysilane, 3-glycidoxypropyltriethoxysilane, p-styryltrimethoxysilane, 3-aminopropyltrimethoxysilane, 3-aminopropyltriethoxysilane, and N-phenyl-3-aminopropyltrimethoxysilane; a titanium chelating agent; an aluminum chelating agent; and a reaction product of an aromatic amine compound with a silicon compound containing an alkoxy group. Two or more of these compounds may be contained together. The content of the adhesion improving agent is preferably 0.1 to 10% by weight in the solid content of the photosensitive resin composition.

<Other Component—Surfactant>

If necessary, the photosensitive resin composition to be used in the present invention may contain a surfactant. When the surfactant is contained, the wettability between a photosensitive resin composition film and a substrate can be improved. Examples of the surfactant include: a silicone-type surfactant, such as a SH series, a SD series, and a ST series manufactured by Dow Corning Toray Silicone Co., Ltd., a BYK series manufactured by BYK Japan KK, a KP series manufactured by Shin-Etsu Chemical Co., Ltd., a DISFOAM series manufactured by NOF Corporation, and a TSF series manufactured by Momentive Performance Materials Japan LLC; a fluorine-type surfactant, such as a "MEGAFACE (a registered trademark)" series manufactured by DIC Corporation, a Fluorad series manufactured by Sumitomo 3M Ltd., a "SURFLON (a registered trademark)" series and an "AsahiGuard (a registered trademark)" series both manufactured by Asahi Glass Co., Ltd., an EF series manufactured by Shin Akita Chemicals Corporation, and a PolyFox series manufactured by OMNOVA Solutions Inc.; and a surfactant containing a polymer of a (meth)acrylic compound, such as a POLYFLOW series manufactured by Kyoeisha Chemical Co., Ltd., and a "DISPARLON (a registered trademark)" series manufactured by Kusumoto Chemicals, Ltd. Two or more of these surfactants may be contained together.

The content of the surfactant is preferably 0.001 to 1% by weight in the solid content of the photosensitive resin composition.

<Other Component—Phenolic Hydroxy Group-Containing Compound>

If necessary, the positive type photosensitive resin composition to be used in the present invention may contain a compound having a phenolic hydroxy group. The photosensitive resin composition containing the compound having a phenolic hydroxy group will be scarcely dissolved in an alkaline developer before exposure to light, but will be easily dissolved in the alkaline developer after exposure to light, leading to a decreased film loss during development, and the development can be carried out readily within a short time, resulting in the improvement in sensitivity. Examples of the compound having a phenolic hydroxy group include Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCRIPZ, BisOCP-IPZ, BisOIPP-CP, Bis26X-IPZ, BisOTBP-CP, TekP-4HBPA (tetrakis P-DO-BPA), TrisPHAP, TrisP-PA, TrisP-PHBA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetris-FR-CR, BisRS-26X, and BisRS-OCHP (product names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, and TEP-BIP-A (product names, manufactured by Asahi Yukizai Corporation), 1,4-dihydroxynaphthalene, 1,5-dihydroxynaphthalene, 1,6-dihydroxynaphthalene, 1,7-dihydroxynaphthalene, 2,3-dihydroxynaphthalene, 2,6-dihydroxynaphthalene, 2,7-dihydroxynaphthalene, 2,4-dihydroxyquinoline, 2,6-dihydroxyquinoline, 2,3-dihydroxyquinoxaline, anthracen-1,2,10-triol, anthracen-1,8,9-triol and 8-quinolinol. Two or more of these compounds may be contained together.

The content of the compound having a phenolic hydroxy group is preferably 1 to 20% by weight in the solid content of the photosensitive resin composition.

<Other Component—Sensitizer>

If necessary, the negative type photosensitive resin composition to be used in the present invention may contain a sensitizer. The sensitizer is a compound which can absorb energy supplied by exposure to light to generate an excited triplet electron as the result of internal conversion and intersystem crossing and, consequently, can mediate the transfer of the energy to (b2) the photoinitiator described above and the like. When the sensitizer is contained, the sensitivity upon exposure to light can be improved.

The sensitizer is preferably a thioxanthone-type sensitizer. Examples of the thioxanthone-type sensitizer include thioxanthone, 2-methylthioxanthone, 2-chlorothioxanthone, 2-isopropylthioxanthone, 2,4-dimethylthioxanthone, 2,4-diethylthioxanthone, and 2,4-dichlorothioxanthone. Two or more of these sensitizers may be contained together.

The content of the sensitizer in the negative type photosensitive resin composition to be used in the present invention is preferably 1 part by weight or more based on 100 parts by weight of the total content of (A) the alkali-soluble resin and (G) the radical-polymerizable compound from the viewpoint of sensitivity. On the other hand, the content of the sensitizer is preferably 8 parts by weight or less from the viewpoint of resolution and pattern form.

<Other Component—Chain Transfer Agent>

If necessary, the negative type photosensitive resin composition to be used in the present invention may contain a chain transfer agent. The chain transfer agent is a compound which can receive a radical from a polymer growth terminal of a polymer chain produced by radical polymerization upon exposure to light to mediate the transfer of the radical to another polymer chain. When the chain transfer agent is contained, the sensitivity upon exposure to light can be improved. This is probably because a radical generated upon the exposure to light is transferred to another polymer chain by the action of the chain transfer agent to cause radical crosslinking in a deeper part in the film. Particularly in the case where the photosensitive resin composition contains (Ca) the blackening agent as (C) the coloring material described above, light for the exposure is absorbed by (Ca) the blackening agent and therefore the light sometimes cannot reach a deeper part of the film. In contrast, in the case where the chain transfer agent is contained, radical crosslinking can be achieved also in a deeper part of the film as the result of the transfer of the radical by the action of the chain transfer agent, resulting in the improvement in sensitivity upon exposure to light. In addition, when the chain transfer agent is contained, a low-tapered pattern form can be produced. This is probably because the molecular weight of a polymer chain produced by the radical polymerization upon the exposure to light can be controlled by the transfer of the radical by the chain transfer agent. Namely, it is considered as follows. When the chain transfer agent is contained, the production of a polymer chain having a significantly high molecular weight, which is caused by excessive radical polymerization upon exposure to light, can be prevented, resulting in the prevention of increase in the softening point of the resultant film. As a result, the reflowing property of a pattern during thermal curing is improved, and a low-tapered pattern form can be produced.

The chain transfer agent is preferably a thiol-type chain transfer agent. Examples of the thiol-type chain transfer agent include β-mercaptopropionic acid, methyl β-mercaptopropionate, ethyl β-mercaptopropionate, 2-ethylhexyl β-mercaptopropionate, n-octyl β-mercaptopropionate, methoxybutyl β-mercaptopropionate, stearyl β-mercaptopropionate, isononyl β-mercaptopropionate, β-mercaptobutanoic acid, methyl β-mercaptobutanoate, ethyl β-mercaptobutanoate, 2-ethylhexyl β-mercaptobutanoate, n-octyl β-mercaptobutanoate, methoxybutyl β-mercaptobutanoate, stearyl β-mercaptobutanoate, isononyl β-mercaptobutanoate, methyl thioglycolate, n-octyl thioglycolate, methoxybutyl thioglycolate, 1,4-bis(3-mercaptobutanoyloxy)butane, 1,4-bis(3-mercaptopropionyloxy)butane, 1,4-bis(thioglycoloyloxy)butane, ethylene glycol bis(thioglycolate), trimethylolethane tris(3-mercaptopropionate), trimethylolethane tris(3-mercaptobutyrate), trimethylolpropane tris(3-mercaptopropionate), trimethylolpropane tris(3-mercaptobutyrate), trimethylolpropane tris(thioglycolate), 1,3,5-tris[(3-mercaptopropionyloxy)ethyl]isocyanuric acid, 1,3,5-tris[(3-mercaptobutanoyloxy)ethyl]isocyanuric acid, pentaerythritol tetrakis(3-mercaptopropionate), pentaerythritol tetrakis(3-mercaptobutyrate), pentaerythritol tetrakis(thioglycolate), dipentaerythritol hexakis(3-mercaptopropionate), and dipentaerythritol hexakis(3-mercaptobutyrate). Two or more of these chain transfer agents may be contained together. From the viewpoint of the improvement in the sensitivity upon exposure to light and the formation of a low-tapered pattern form, 1,4-bis(3-mercaptobutanoyloxy)butane, 1,4-bis(3-mercaptopropionyloxy)butane, 1,4-bis(thioglycoloyloxy)butane, ethylene glycol bis(thioglycolate), trimethylolethane tris(3-mercaptopropionate), trimethylolethane tris(3-mercaptobutyrate), trimethylolpropane tris(3-mercaptopropionate), trimethylolpropane tris(3-mercaptobutyrate), trimethylolpropane tris(thioglycolate), 1,3,5-tris[(3-mercaptopropionyloxy)ethyl]isocyanuric acid, 1,3,5-tris[(3-mercaptobutanoyloxy)ethyl]isocyanuric acid, pentaerythritol tetrakis(3-mercaptopropionate), pentaerythritol tetrakis(3-mercaptobutyrate), pentaerythritol tetrakis (thioglycolate), dipentaerythritol hexakis(3-mercaptopropionate), and dipentaerythritol hexakis(3-mercaptobutyrate) are preferred as the chain transfer agent.

The content of the chain transfer agent in the negative type photosensitive resin composition to be used in the present invention is preferably 1 part by weight or more based on 100 parts by weight of the total content of (A) the alkali-soluble resin and (G) the radical-polymerizable compound from the viewpoint of sensitivity and pattern form. On the other hand, the content of the chain transfer agent is preferably 8 parts by weight or less from the viewpoint of resolution and the heat resistance of the insulating layer.

<Other Component—Polymerization Inhibitor>

If necessary, the negative type photosensitive resin composition to be used in the present invention may contain a polymerization inhibitor. The polymerization inhibitor is a compound which can capture a radical generated upon the exposure to light or a radical located at a polymer growth terminal of a polymer chain produced by the radical polymerization upon the exposure to light and can hold the radical therein in the form of a stable radical to terminate the radical polymerization. When the polymerization inhibitor is contained, the formation of residues after development can be prevented, and the resolution after development can be improved.

The polymerization inhibitor is preferably a phenol-type polymerization inhibitor. Examples of the phenol-type polymerization inhibitor include 4-methoxyphenol, 1,4-hydroquinone, 1,4-benzoquinone, 2-t-butyl-4-methoxyphenol, 3-t-butyl-4-methoxyphenol, 4-t-butylcatechol, 2,6-di-t-butyl-4-methylphenol, 2,5-di-t-butyl-1,4-hydroquinone, 2,5-di-t-amyl-1,4-hydroquinone, and "IRGANOX (a registered trademark)" 1010, 1035, 1076, 1098, 1135, 1330, 1726, 1425, 1520, 245, 259, 3114, 565, and 295 (manufactured by BASF SE). Two or more of these polymerization inhibitors may be contained together.

The content of the polymerization inhibitor in the negative type photosensitive resin composition to be used in the present invention is preferably 0.1 parts by weight or more based on 100 parts by weight of the total content of (A) the alkali-soluble resin and (G) the radical-polymerizable compound from the viewpoint of resolution and the heat resistance of the insulating layer. On the other hand, the content of the polymerization inhibitor is preferably 3 parts by weight or less from the viewpoint of sensitivity.

<Other Additives>

The photosensitive resin composition to be used in the present invention may additionally contain another resin. Examples of the "another resin" include a polyamide, a polyamideimide, an epoxy resin, a novolac resin, a urea resin, a polyurethane, and precursors thereof.

The photosensitive resin composition to be used in the present invention may contain a thermal acid generator, as long as the reliability of the organic EL display device cannot be deteriorated. The thermal acid generator can generate an acid by heating to accelerate the cross-linking reaction of the thermally crosslinking agent. In addition, when (A) the alkali-soluble resin has an unclosed imide or oxazole ring structure, the thermal acid generator can accelerate the cyclization thereof to further improve the mechanical properties of the cured film.

The thermal decomposition initiation temperature of the thermal acid generator to be used in the present invention is preferably 50° C. to 270° C., more preferably 250° C. or lower. Preferably selected is a thermal acid generator which does not generate an acid upon the drying (prebaking: about 70 to 140° C.) after the application of the photosensitive resin composition to be used in the present invention onto a substrate and generates an acid upon a heating treatment (curing: about 100 to 400° C.) after exposure to light and subsequent patterning by development. This is because the deterioration in sensitivity upon development can be prevented.

The acid generated from the thermal acid generator to be used in the present invention is preferably a strong acid, and is preferably an arylsulfonic acid such as p-toluenesulfonic acid and benzenesulfonic acid, an alkylsulfonic acid such as methanesulfonic acid, ethanesulfonic acid, propanesulfonic acid, and butanesulfonic acid, a haloalkylsulfonic acid such as trifluoromethylsulfonic acid, or the like. The acid is used in the form of a salt such as an onium salt or a covalent compound such as an imide sulfonate. Two or more of these acids may be contained together.

The content of the thermal acid generator to be used in the present invention is preferably 0.1% by weight or more in the solid content of the photosensitive resin composition from the viewpoint of the mechanical properties and chemical resistance of the insulating layer. On the other hand, the content of the thermal acid generator is preferably 3% by weight or less from the viewpoint of the electrical insulation property of the insulating layer.

The organic EL display device of the present invention preferably further has an ultraviolet absorbing layer, and the reliability can be improved. As the ultraviolet absorbing layer, a layer that absorbs light of a wavelength of 320 nm or less is preferred, a layer that absorbs light of a wavelength of 360 nm or less is more preferred, and a layer that absorbs light of a wavelength of 420 nm or less is further preferred. However, since light of a wavelength of 420 nm or more covers the wavelength of blue light used for display, the ultraviolet absorbing layer preferably has high transmittance in a wavelength region of 420 nm or more. This is particularly effective when the organic EL display device of the present invention is used outdoors.

The ultraviolet absorbing layer preferably contains a resin such as polyimide resin, polyamide resin, polyamideimide resin, polycarbonate resin, polyester resin, polyether sulfone resin, polyarylate resin, polyolefin resin, polyethylene terephthalate resin, polymethyl methacrylate resin, polysulfone resin, polyethylene resin, polyvinyl chloride resin, alicyclic olefin polymer resin, acrylic polymer resin, and cellulose ester resin. Two or more of these resins may be contained together. Among these resins, polyimide resin and polyamide resin are preferred. The ultraviolet absorbing layer may contain an ultraviolet absorber. Examples of the ultraviolet absorber include benzophenone-based compounds, oxybenzophenone-based compounds, benzotriazole-based compounds, salicylate-based compounds, salicylic acid ester-based compounds, acrylonitrile-based compounds, cyanoacrylate-based compounds, hindered amine-based compounds, triazine-based compounds, nickel complex salt-based compounds, ultrafine particle titanium oxide, metal complex salt compounds, and other polymer ultraviolet absorbers. Two or more of these ultraviolet absorbers may be contained together. The ultraviolet absorbing layer is preferably a benzotriazole-based compound or a benzophenone-based compound excellent in transparency and more preferably a benzotriazole-based compound.

Examples of the benzotriazole-based compounds include 2-(2'-hydroxy-5'-methylphenyl)benzotriazole, 2-(2'-hydroxy-3',5'-di-tert-butylphenyl)benzotriazole, 2-(2'-hydroxy-3'-tert-butyl-5'-methylphenyl)benzotriazole, 2-(2'-hydroxy-3',5'-di-tert-butylphenyl)-5-chlorobenzotriazole, 2-(2'-hydroxy-3'-(3",4",5",6"-tetrahydrophthalimidomethyl)-5'-methylphenyl)benzotriazole, 2,2'-methylenebis(4-(1,1,3,3-tetramethylbutyl)-6-(2H-benzotriazol-2-yl)phenol), 2-(2'-hydroxy-3'-tert-butyl-5'-methylphenyl)-5-chlorobenzotriazole, 2-(2H-benzotriazol-2-yl)-6-(dodecyl)-4-methylphenol, octyl-3-[3-tert-butyl-4-hydroxy-5-(chloro-2H-benzotriazol-2-yl)phenyl]propionate, and 2-ethylhexyl-3-[3-tert-butyl-4-hydroxy-5-(5-chloro-2H-benzotriazol-2-yl)phenyl]propionate. Two or more of these compounds may be contained together. In addition, examples of commercially available products of the benzotriazole-based compound include "TINUVIN (a registered trademark)" 109, "TINUVIN" 171, and "TINUVIN 326" (manufactured by BASF Japan Ltd.).

Examples of the benzophenone-based compounds include 2,4-dihydroxybenzophenone, 2,2'-dihydroxy-4-methoxybenzophenone, 2-hydroxy-4-methoxy-5-sulfobenzophenone, and bis(2-methoxy-4-hydroxy-5-benzoylphenylmethane). Two or more of these compounds may be contained together.

Examples of the polymer ultraviolet absorbers include a reaction type UV absorbent RUVA-93 manufactured by Otsuka Chemical Co., Ltd.

The organic EL display device of the present invention preferably further has a substrate. Examples of the substrate include glass and films on which an electrode, an insulating layer, and an organic EL layer can be formed. In order to suppress deterioration of the organic EL layer, the substrate preferably has high gas barrier properties. In the case of the bottom-emission type, it is preferable that the transparency of the substrate be high.

As a technique for suppressing external light reflection, an organic EL display device having a polarizing layer can be mentioned. As the polarizing layer, for example, a film obtained by dyeing a polyvinyl alcohol-based film with iodine and uniaxially stretching the film is often used. When the polarizing layer is provided, external light reflection can be suppressed. On the other hand, the emitted light from an organic EL layer is partially blocked by the polarizing layer, and only transmitted polarized light is output to the outside, so that the luminance of the organic EL display device tends to decrease. Furthermore, when the polarizing layer is provided, it becomes difficult to reduce the thickness and weight of the display device and improve the flexibility of the display device. In view of these points, in the present invention, it is preferable not to include the polarizing layer. In the organic EL display device of the present invention, external light reflection can be reduced without using the polarizing layer, and the luminance of the organic EL display device can be improved as compared with the case of using the polarizing layer.

When the organic EL display device of the present invention is of an active matrix type, the organic EL display device has a TFT (Thin Film Transistor) in the above-mentioned substrate. In the organic EL display device of the present invention having a black insulating layer, the TFT can be shielded and protected. In particular, in the case of a TFT using an oxide semiconductor containing In, Ga, Sn, Ti, Nb, Sb and/or Zn, for example, a change in threshold voltage and deterioration due to external light or emitted light from an organic EL layer can be suppressed, so that it becomes possible to stabilize characteristics and improve reliability. The same effect can be obtained by blackening a flattening layer formed so as to cover a TFT layer.

Next, a method of manufacturing the organic EL display device of the present invention will be described. First, a production method for a photosensitive resin composition constituting an insulating layer will be described.

<Production Method for Photosensitive Resin Composition>

A representative production method for the photosensitive resin composition to be used in the present invention will be described. For example, when (C1) the pigment is contained as (C) the coloring material, it is preferable that (F) the dispersant be added to a solution of (A) the alkali-soluble resin and (D) the organic solvent, and (C1) the pigment be dispersed in this mixture solution by using a dispersion machine so as to prepare a pigment dispersion liquid. Next, it is preferable that (B) the photosensitive agent and other additives be added to the pigment dispersion liquid, and stirring be performed for 20 minutes to 3 hours to form a homogeneous solution. After stirring, the obtained solution is filtered to obtain a photosensitive resin composition.

Examples of the dispersion machine include a ball mill, a bead mill, a sand grinder, a three-roll mill, and a high-speed impact mill. From the viewpoint of more efficient dispersion and finer dispersion, it is preferable that the dispersion machine be a bead mill. Examples of the bead mill include a co-ball mill, a basket mill, a pin mill, and a DYNO mill. Examples of beads of the bead mill include titania beads, zirconia beads, and zircon beads. The bead diameter of the bead mill is preferably 0.01 to 6 mm, more preferably 0.015 to 5 mm, and further preferably 0.03 to 3 mm. In the case where the primary particle diameter of (C1) the pigment and the particle diameter of secondary particles formed by aggregation of primary particles of (C1) the pigment is several hundred nanometers or less, small beads having a bead diameter of 0.015 to 0.1 mm are preferred. In this case, a bead mill that has a separator based on a centrifugal separation system which is capable of separating small beads and the pigment dispersion liquid is preferred. On the other hand, in the case where (C1) the pigment contains large particles of several hundred nanometers or greater, beads having a bead diameter of 0.1 to 6 mm are preferred from the viewpoint of more efficient dispersion.

<Method of Manufacturing Organic EL Display Device of the Present Invention>

First, it is preferable that a first electrode be formed on a substrate. As described above, in the case of the bottom-emission type, a transparent electrode is selected, and in the case of the top-emission type, a non-transparent electrode is selected. Examples of a method of forming an electrode include a method of forming a material constituting the first electrode into a film and then pattern-processing the film. Examples of a film forming method include a sputtering method, a vapor deposition method, a CVD method, a spin coating method, a slit coating method, a dip coating method, a spray coating method, and a printing method, and a suitable method according to materials can be selected. Examples of a pattern processing method include an etching method using a shadow mask, a photomask, or the like. In general, a film is formed by a sputtering method and pattern-processed by an etching method using a photoresist.

Next, it is preferable that an insulating layer be formed on the first electrode. It is preferable that the above-mentioned photosensitive resin composition be applied on the substrate having the first electrode to obtain a coating film of the photosensitive resin composition. Examples of a coating method include a spin coating method, a slit coating method, a dip coating method, a spray coating method, and a printing method. Prior to the coating, the substrate to be coated with the photosensitive resin composition may be subjected to a pretreatment with an adhesion improving agent. For example, there is a method of treating the substrate surface with a solution prepared by dissolving an adhesion improving agent in a content of 0.5 to 20% by weight in a solvent such as isopropanol (2-propanol), ethanol, methanol, water, tetrahydrofuran, propylene glycol monomethyl ether acetate, propylene glycol monomethyl ether, ethyl lactate, and diethyl adipate. Examples of the treating method for the substrate surface include a spin coating method, a slit die coating method, a bar coating method, a dip coating method, a spray coating method, and a steaming method. After the coating, it is preferable that the coating film be subjected to a reduced pressure drying treatment as necessary, and then, subjected to a heat treatment for 1 minute to several hours within the range of 50° C. to 180° C. using a hot plate, an oven, infrared rays, or the like.

Next, it is preferable to form a pattern from the photosensitive resin film obtained. It is preferable that the surface of the photosensitive resin film be irradiated with actinic rays through a mask having a desired pattern. Examples of the actinic rays used for exposure to light include ultraviolet rays, visible rays, electron rays, and X-rays. In the present invention, it is preferable to use the i-line (365 nm), h-line (405 nm) or g-line (436 nm) emitted from a mercury lamp.

After the exposure to light, in the case of the positive type, the exposed region is preferably removed with a developing solution, and in the case of the negative type, the unexposed region is preferably removed with a developing solution. As the developing solution, an aqueous solution of an alkaline compound such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, and hexamethylenediamine is preferred. If necessary, these aqueous alkali solutions may be compounded with a polar solvent such as N-methyl-2-pyrrolidone, N,N-dimethylformamide, N,N-dimethylacetamide, dimethyl sulfoxide, γ-butyrolactone, and dimethylacrylamide; a kind of alcohol such as methanol, ethanol, and isopropanol (2-propanol); a kind of ester such as ethyl lactate and propylene glycol monomethyl ether acetate; and a kind of ketone such as cyclopentanone, cyclohexanone, isobutyl ketone, and methyl isobutyl ketone. Examples of the developing system include the spray system, paddle system, immersion system, and ultrasonic system.

Next, it is preferable that the pattern formed by development be subjected to a rinsing treatment with pure water. If necessary, the pure water may also be compounded with a kind of alcohol such as ethanol and isopropyl alcohol, a kind of ester such as ethyl lactate and propylene glycol monomethyl ether acetate, and the like to perform a rinsing treatment.

Next, it is preferable to carry out a bleaching treatment. For example, in the case of a positive type photosensitive resin composition containing a quinone diazide compound, the quinone diazide compound can be converted to an indene carboxylic acid by the bleaching treatment to prevent the generation of acid anhydrides. The bleaching treatment may be carried out after a heating curing step to be described later. For the bleaching treatment, it is preferable to apply an actinic ray such as an ultraviolet ray, visible light, an electron beam, and an X-ray, and, for example, it is preferable to apply the i-line (365 nm), h-line (405 nm) or g-line (436 nm) emitted from a mercury lamp at a dose of about 10 to 10,000 mJ/cm$^2$.

Next, it is preferable to perform a heating treatment. Since a residual solvent and components low in heat resistance can be removed by the heating treatment, the heat resistance and the chemical resistance of the insulating layer can be enhanced. In particular, in the case where a polyimide precursor, a polybenzoxazole precursor, a copolymer thereof or a copolymer of those and a polyimide is contained as (A) the alkali-soluble resin, since the imide ring or the oxazole ring can be formed by the heating treatment, the heat resistance and the chemical resistance of the insulating layer can be improved. In the case where (E) the thermally crosslinking agent is contained, the thermally crosslinking reaction can be promoted by the heating treatment, and the heat resistance and the chemical resistance of the insulating layer can be improved. It is preferable that this heating treatment be performed for 5 minutes to 5 hours by setting predetermined temperature levels to gradually increase the temperature or setting a temperature range to continuously increase the temperature. In one case, a method of performing the heating treatment at 150° C. and 250° C. for 30 minutes each and a method of linearly increasing the temperature over a 2-hour period from room temperature to 300° C. can be mentioned. The heating treatment temperature is preferably 150° C. or higher and more preferably 200° C. or higher. On the other hand, the heating treatment temperature is preferably 400° C. or lower and more preferably 350° C. or lower.

Thereafter, it is preferable that an organic EL layer be formed in a necessary region by a mask deposition method or an inkjet method. A typical mask deposition method is a method in which an organic compound is vapor-deposited using a deposition mask to form a pattern, and in this method, the vapor deposition is carried out while placing a deposition mask having a desired pattern as an opening section on the deposition source side of the substrate. In order to produce a high-precision deposition pattern, it is preferable to closely adhere a deposition mask having high flatness onto a substrate, and a technique in which a tension is applied to the deposition mask, a technique in which a deposition mask is closely adhered onto a substrate with a magnet that is placed on the back surface of the substrate, or the like is generally employed. Examples of the production method for the deposition mask include an etching method, mechanical grinding, a sandblast method, a sintering method, a laser processing method, and the utilization of a photosensitive resin. In the case where a fine pattern is required, an etching method and an electrocasting method each capable of achieving excellent processing precision are commonly employed.

It is preferable that a second electrode be subsequently formed. In the case of the bottom-emission type, a nontransparent electrode is selected, and in the case of the top-emission type, a transparent electrode is selected. From the viewpoint of reducing damage to the organic EL layer, it is preferable that the second electrode be formed by a mask deposition method using a deposition mask.

As described above, an organic EL display device is completed in which an area in which the second electrode crosses over the first electrode and the insulating layer is not present emits light. In the organic EL display device, the area that is called a luminescent pixel is an area in which the second electrode crosses over the first electrode and the first electrode and the second electrode, which are placed so as to face each other, overlap with each other and is an area which is defined by the insulating layer on the first electrode. In an active matrix-type display, an area in which a switching unit is formed may be arranged so as to occupy a part of the luminescent pixel, and the luminescent pixel may have a partially missing shape rather than a rectangular shape. However, the shape of the luminescent pixel is not limited to the above-mentioned shapes, and the shape of the luminescent pixel may also be a circular shape, and may be altered readily depending on the shape of the insulating layer.

Thereafter, it is preferable to perform sealing for the purpose of protecting the organic EL layer. It is preferable to prevent the organic EL layer from coming into contact with oxygen and water, and it is preferable to adhere a glass or metallic sealing canister or a gas barrier film in vacuum or in an absolutely dry atmosphere. At the same time, it is also possible to enclose desiccant and moisture absorbent.

A device in which organic EL layers having emission peak wavelengths in respective red, green and blue color regions are arranged or a device in which organic EL layers that emit white light are prepared on the whole face thereof to be used in combination with a separately prepared color filter is called a color display. In the color display, usually, peak wavelengths of light displayed in the red color region, green color region and blue color region lie within the ranges of 560 to 700 nm, 500 to 560 nm and 420 to 500 nm, respectively.

EXAMPLES

Hereinafter, the present invention will be described with reference to examples and the like. First, evaluation methods will be described.

<Measurement of Film Thickness>

The film thicknesses of the electrodes and the insulating layer in each of examples and comparative examples were measured using a surface roughness measuring machine (Surfcom 1400D manufactured by Tokyo Seimitsu Co., Ltd.). The thickness of a film included in an ultraviolet absorbing plate or a circularly polarizing plate was measured using a dial gauge (manufactured by PEACOCK, product name "DG-205 type pds-2").

<Evaluation of Non-Transparent Electrode>

A metal layer having a thickness of 100 nm was formed on a 38 mm×46 mm non-alkali glass substrate by a sputtering method, using a magnetron sputtering device (SH-450; manufactured by ULVAC, Inc.). The film composition was changed as listed in Table 1 by changing the target composition, and the film composition was confirmed by an ICP-AES method (inductively coupled plasma analysis method). In addition, an ITO transparent electric conductive film having a thickness of 10 nm was formed on the metal layer to obtain non-transparent electrodes 1 to 13.

For the non-transparent electrodes 1 to 13 obtained, the reflectance and transmittance at a wavelength of 550 nm were measured with a spectrophotometer (U-4100; manufactured by Hitachi High-Technologies Corporation). The measurement results of the metal layer compositions, reflectances, and transmittances of the non-transparent electrodes 1 to 13 are listed in Table 1.

TABLE 1

| Non-transparent electrode | Metal layer composition (mass ratio) | Electrode reflectance (%) | Electrode transmittance (%) |
|---|---|---|---|
| 1 | AlGaNi (94:1:5) | 79 | 0 |
| 2 | AgNdCu (90:6:4) | 71 | 0 |
| 3 | AgInSn (88:8:4) | 63 | 0 |
| 4 | AgGeSn (65:21:14) | 48 | 0 |
| 5 | CuZnMg (79:18:3) | 29 | 0 |
| 6 | MgCu (70:30) | 75 | 0 |
| 7 | MgAg (50:50) | 99 | 0 |
| 8 | CuCrMg (69:28:3) | 40 | 0 |
| 9 | CuCrNi (69:22:9) | 22 | 0 |
| 10 | CuFeC (58:22:20) | 14 | 0 |
| 11 | C3N4—Fe (97:3) | 8 | 0 |
| 12 | C3N4 (100) | 3 | 0 |
| 13 | FeCrNi (60:23:17) | 26 | 0 |

<Evaluation of Light Blocking Capability of Insulating Layer>

Each of photosensitive resin compositions 1 to 8 obtained by Preparation Examples 7 to 14 was applied on a 38 mm×46 mm non-alkali glass substrate by a spin coating method so that the film thickness after curing was 1.0 μm, and prebaked for 2 minutes on a hot plate maintained at 120° C. This film was subjected to UV exposure through a photomask, after which the film was subjected to development with a 2.38% by weight aqueous TMAH solution to make only an unnecessary portion dissolve, and then, the film was rinsed with pure water to obtain a resin pattern. The obtained resin pattern was cured for 60 minutes at 250° C. under a nitrogen atmosphere, using a high-temperature inert gas oven (INH-9CD-S; manufactured by Koyo Thermo Systems Co., Ltd.). In this way, insulating layers 1 to 8 having a 16 mm-square tetragonal shape were each formed at a central portion of the substrate.

Using a transmission densitometer (X-Rite 361T(V), manufactured by Sakata Inx Eng. Co., Ltd.), incident light intensity ($I_0$) and transmitted light intensity (I) of each of the created insulating layers were measured. As an indicator of the light blocking capability, the optical density (hereinafter referred to as "OD" value) was calculated by the following expression (1). The result is listed in Table 2.

$$\text{OD value} = \log_{10}(I_0/I) \quad (1)$$

TABLE 2

| Insulating layer | Photosensitive resin composition | Light blocking capability (OD value) |
|---|---|---|
| 1 | 1 | 1.1 |
| 2 | 2 | 1.1 |
| 3 | 3 | 1.0 |
| 4 | 4 | 1.0 |
| 5 | 5 | 0.9 |
| 6 | 6 | 0.9 |
| 7 | 7 | 0.8 |
| 8 | 8 | 0 |

<Measurement of Number Average Particle Diameter of Pigment>

For a solution prepared by diluting each of pigment dispersion liquids Bk-1 to 6 obtained by Preparation Examples 1 to 0.6 to a concentration of $1.0 \times 10^{-5}$ to 40 vol % using propyleneglycol monomethyl ether acetate (PGMEA) as a diluting solvent, using a zeta potential/particle diameter/molecular weight measurement apparatus (Zeta Sizer Nano ZSP; manufactured by Sysmex Corporation), the refractive index of the diluting solvent was set to the refractive index of the PGMEA, and the refractive index of the measurement subject was set to 1.8, and laser light of 633 nm wavelength was applied to measure a number average particle diameter of the pigment in the pigment dispersion liquid.

<Evaluation of Reflectance of Organic EL Display Device>

For the organic EL display device obtained in each of examples and comparative examples, the reflectance of the surface of the organic EL display device (a value at a wavelength of 550 nm of an SCI mode including specularly reflected light) was measured using a spectrocolorimeter (CM-2002; manufactured by Konica Minolta, Inc.). The smaller the reflectance is, the more preferable it is, because external light reflection can be suppressed.

<Evaluation of Dark Luminance of Organic EL Display Device>

Figure 3:
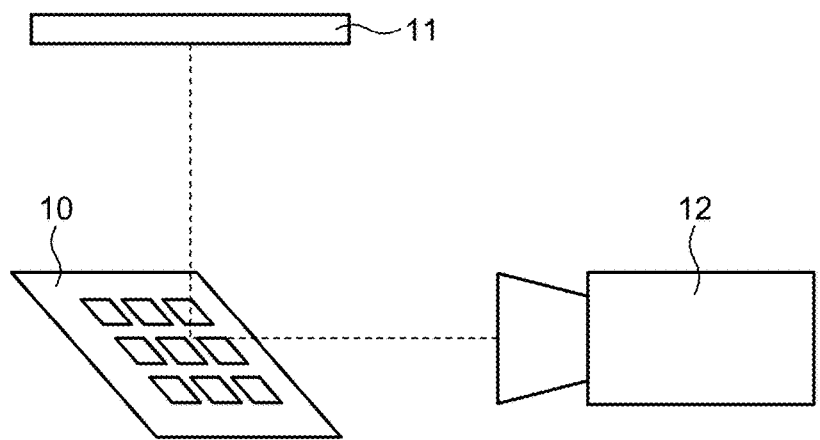
FIG. 3 is a schematic view of an environment for evaluating a dark luminance, a bright luminance, and a chromaticity of an organic EL display device in an example.

FIG. 3 illustrates a schematic view of a dark luminance evaluation environment of the organic EL display device. An organic EL display device 10, which was not lighted, obtained in each of examples and comparative examples was tilted to 45° with respect to the horizontal at a position 2.4 m below a lighted fluorescent lamp 11 and in an environment of an illuminance of 500 lx, and using the organic EL display device 10 as a reflecting surface, the fluorescent lamp 11 and a spectroradiometer (CS-1000; manufactured by Konica Minolta, Inc.) 12 were arranged to face each other. The luminance of the surface of the organic EL display device 10 in this environment was measured using the spectroradiometer 12 and taken as a dark luminance.

<Evaluation of Bright Luminance and Chromaticity of Organic EL Display Device>

Under the same environment as the dark luminance evaluation, the organic EL display device 10 obtained in each of examples and comparative examples was caused to emit light at a direct current drive mode of 0.625 mA, and the luminance and chromaticity of the surface of the organic EL display device 10 were measured using the spectroradiometer 12. Using the chromaticity (x, y=0.350, 0.600) which is the luminescent color as a reference, color shift was judged based on a difference between the reference and the measured value. If the difference of x and the difference of y were within ±0.01, it was determined as A. If the difference of x and the difference of y were ±0.02 or more, it was determined as C. Other examples were judged as B.

<Contrast Evaluation of Organic EL Display Device>

A ratio between the dark luminance and the bright luminance measured by the above-mentioned method was calculated with the dark luminance being 1. The larger the ratio is, the more preferable it is, because the contrast is high.

<Reliability Evaluation of Organic EL Display Device>

The organic EL display device obtained in each of examples and comparative examples was placed on a hot plate heated to 80° C. so that the light-emitting surface faced upward and irradiated with UV light with a wavelength of 365 nm at an illuminance of 0.6 mW/cm². Immediately after irradiation (0 hours) and at the end of each of 250 hours, 500 hours and 1,000 hours, the organic EL display device was caused to emit light at a direct current drive mode of 0.625 mA, and the ratio of the area of the light-emitting part to the area of the light-emitting pixel (pixel luminescence area ratio) was measured.

Synthesis Example 1: Synthesis of Hydroxy Group-Containing Diamine Compound

In a mixed solvent of 100 mL of acetone and 17.4 g (0.3 mol) of propylene oxide, 18.3 g (0.05 mol) of 2,2-bis(3-amino-4-hydroxyphenyl)hexafluoropropane (BAHF) was dissolved, and the solution was cooled to −15° C. To this, a solution prepared by dissolving 20.4 g (0.11 mol) of 3-nitrobenzoyl chloride in 100 mL of acetone was added dropwise. After the completion of dropping, the contents were allowed to undergo a reaction for 4 hours at −15° C., and then, the temperature thereof was returned to room temperature. The precipitated white solid matter was filtered and dried under vacuum at 50° C.

In a 300-mL stainless steel autoclave, 30 g of the white solid matter was placed, the solid matter was dispersed in 250 mL of methyl cellosolve, and to this dispersion, 2 g of palladium carbon catalyst (5% by weight of palladium) was added. Hydrogen was introduced thereinto by means of a balloon, and the contents were allowed to undergo a reductive reaction at room temperature. After about 2 hours, it was confirmed that the balloon no longer deflated, and the reaction was terminated. After the completion of the reaction, the palladium compound as the catalyst was removed by filtration, and the contents were concentrated on a rotary evaporator to obtain a hydroxy group-containing diamine compound represented by the following formula.

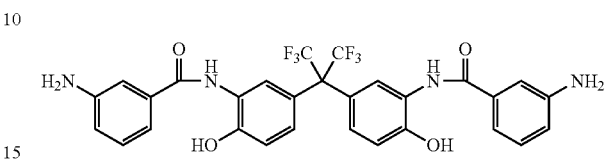

Synthesis Example 2: Synthesis of (A-1) Alkali-Soluble Resin

Under a stream of dry nitrogen, 31.0 g (0.10 mol) of bis(3,4-dicarboxyphenyl) ether dianhydride (ODPA) was dissolved in 500 g of N-methyl-2-pyrrolidone (NMP). To this, 45.35 g (0.075 mol) of the hydroxy group-containing diamine compound obtained in Synthesis Example 1 and 1.24 g (0.005 mol) of 1,3-bis(3-aminopropyl)tetramethyldisiloxane (SiDA) were added together with 50 g of NMP, and the contents were allowed to undergo a reaction for 1 hour at 20° C. and then allowed to undergo a reaction for 2 hours at 50° C. Next, 4.36 g (0.04 mol) of 4-aminophenol as a terminal blocking agent was added together with 5 g of NMP, and the contents were allowed to undergo a reaction for 2 hours at 50° C. Afterward, a solution prepared by diluting 23.8 g (0.20 mol) of N,N-dimethylformamide dimethylacetal with 50 g of NMP was added dropwise over a period of 10 minutes. After dropping, the contents were stirred for 3 hours at 50° C. After the stirring, the solution was cooled to room temperature, and then the solution was charged into 3 L of water to obtain a white precipitate. The precipitate was collected by filtration to be washed three times with water, after which the precipitate was dried for 24 hours by means of a vacuum drying machine at 80° C. to obtain (A-1) an alkali-soluble resin which is a polyimide precursor.

Synthesis Example 3: Synthesis of (B-1) Photosensitizer

Under a stream of dry nitrogen, 21.22 g (0.05 mol) of 1,1-bis(4-hydroxyphenyl)-1-[4-[1-(4-hydroxyphenyl)-1-methylethyl]phenyl]ethane (TrisP-PA (trade name, manufactured by Honshu Chemical Industry Co., Ltd.) and 36.27 g (0.135 mol) of 5-naphthoquinone diazide sulfonyl chloride were dissolved in 450 g of 1,4-dioxane, and the solution was allowed to be at room temperature. To this, a mixture of 50 g of 1,4-dioxane and 15.18 g of triethylamine was added dropwise so that the temperature of the system would not become 35° C. or higher. After dropping, the contents were stirred for 2 hours at 30° C. The triethylamine salt was filtered off, and the filtrate was charged into water. Afterward, the separated-out precipitate was collected by filtration. The precipitate was dried by means of a vacuum drying machine to obtain (B-1) a photosensitizer represented by the following formula.

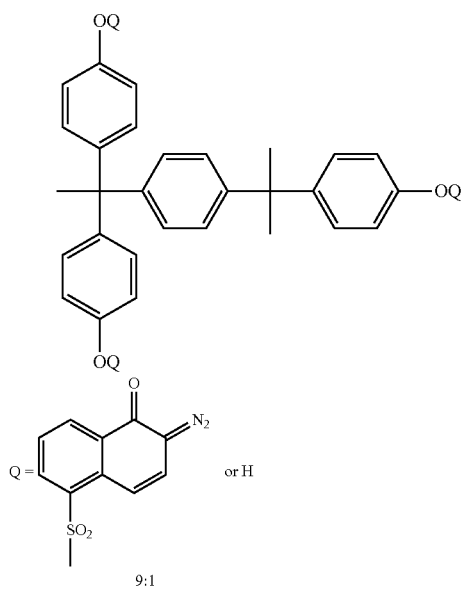

Synthesis Example 4: Synthesis of (PI-1) Alkali-Soluble Resin

In a three neck flask in a dry nitrogen flow, 31.13 g (0.085 mol) of BAHF, 6.21 g (0.0050 mol) of SiDa, 2.18 g (0.020 mol) of 3-aminophenol, or m-aminophenol (MAP), as a terminal blocking agent, and 150.00 g of NMP were weighed out and dissolved. To this, a solution prepared by dissolving 31.02 g (0.10 mol) of ODPA in 50.00 g of NMP was added, and the contents were stirred for 1 hour at 20° C. and then stirred for 4 hours at 50° C. Afterward, 15 g of xylene was added thereto, and the contents were stirred for 5 hours at 150° C. while water was azeotropically boiled together with xylene. After the stirring, the reaction solution was charged into 3 L of water to collect the precipitated solid sediment by filtration. The obtained solid was washed three times with water, after which the solid was dried for 24 hours by means of a vacuum drying machine at 80° C. to obtain (PI-1) an alkali-soluble resin which is a polyimide resin.

Synthesis Example 5: Synthesis of (PIP-1) Alkali-Soluble Resin

In a three neck flask in a dry nitrogen flow, 31.02 g (0.10 mol) of ODPA and 150 g of NMP were weighed out and dissolved. To this, a solution prepared by dissolving 25.64 g (0.070 mol) of BAHF and 6.21 g (0.0050 mol) of SiDA in 50 g of NMP was added, and the contents were stirred for 1 hour at 20° C. and then stirred for 2 hours at 50° C. Next, a solution prepared by dissolving 5.46 g (0.050 mol) of MAP as a terminal blocking agent in 15 g of NMP was added, and the contents were stirred for 2 hours at 50° C. Afterward, a solution prepared by dissolving 23.83 g (0.20 mol) of N,N-dimethylformamide dimethylacetal (DFA) in 15 g of NMP was added dropwise over a period of 10 minutes. After the completion of dropping, the contents were stirred for 3 hours at 50° C. After the stirring, the reaction solution was cooled to room temperature, and then the reaction solution was charged into 3 L of water to obtain a precipitated solid sediment by filtration. The obtained solid was washed three times with water, after which the solid was dried for 24 hours by means of a vacuum drying machine at 80° C. to obtain (PIP-1) an alkali-soluble resin which is a polyimide precursor.

Synthesis Example 6: Synthesis of (CD-1) Alkali-Soluble Resin

In a three neck flask, 35.04 g (0.10 mol) of 9,9-bis(4-hydroxyphenyl)fluorene (BHPF) and 40.31 g of 3-methoxy-n-butylacetate (MBA) were weighed out and dissolved. To this, a solution prepared by dissolving 27.92 g (0.090 mol) of ODPA and 2.96 g (0.020 mol) of phthalic anhydride (PHA) as a terminal blocking agent in 30.00 g of MBA was added, and the contents were stirred for 1 hour at 20° C. Afterward, the contents were stirred for 5 hours at 150° C. under a nitrogen atmosphere. After the stirring, to the obtained solution, a solution prepared by dissolving 14.22 g (0.10 mol) of glycidyl methacrylate (GMA), 0.135 g (0.0010 mol) of dibenzylamine (DBA), and 0.037 g (0.0003 mol) of 4-methoxyphenol (4-MOP) in 10.00 g of MBA was added, and then stirring was performed at 90° C. for 4 hours to obtain a solution of (CD-1) an alkali-soluble resin as a cardo based resin. (CD-1) The alkali-soluble resin obtained had a Mw of 4,000, a carboxylic acid equivalent of 800, and a double bond equivalent of 800.

Synthesis Example 7: Synthesis of Solution of (AC-1) Alkali-Soluble Resin

In a three neck flask, 0.821 g (1 mol %) of 2,2'-azobis (isobutyronitrile) (AIBN) and 29.2.9 g of PGMEA were charged. Next, 21.52 g (50 mol %) of methacrylic acid (MAA), 22.03 g (20 mol %) of tricyclo[$5.2.1.0^{2,6}$]decan-8-yl methacrylate; dimethylol tricyclodecane dimethacrylate (TCDM), and 15.62 g (30 mol %) of styrene (STR) were charged, and after stirring the resultant at room temperature for a while, interior of the flask was sufficiently purged with nitrogen by bubbling, followed by stirring for 5 hours at 70° C. Next, to the resulting solution, a solution prepared by dissolving 14.22 g (20 mol %) of GMA, 0.676 g (1 mol %) of DBA, and 0.186 g (0.3 mol %) of 4-MOP in 59.47 g of PGMEA was added, followed by stirring for 4 hours at 90° C. to obtain a solution of (AC-1) an alkali-soluble resin which is an acrylic resin. (AC-1) The alkali-soluble resin obtained had a Mw of 15,000, a carboxylic acid equivalent of 490, and a double bond equivalent of 730.

Synthesis Example 8: Synthesis of (NV-1) Alkali-Soluble Resin

In a three neck flask equipped with a reflux condenser and a thermometer, 94 g (1.0 mol) of phenol was weighed out, 176 g (0.8 mol) of zinc acetate as a catalyst and 70 mL (0.84 mol) of concentrated hydrochloric acid were added, and then stirring was performed at 95° C. until the solution became homogeneous. Afterward, 81 g of about 37% by weight formaldehyde solution (1.0 mol as formaldehyde) was added, followed by stirring at 95° C. for 11 hours. The product after stirring was dissolved in acetone, reprecipitated twice with distilled water, and dried to obtain (NV-1) an alkali-soluble resin which is a novolak resin.

Synthesis Example 9: Synthesis of (PHS-1) Alkali-Soluble Resin

Under ice cooling, 310 mL of a tetrahydrofuran solution prepared by dissolving 1.5 mol of t-butoxypotassium was stirred and cooled to 5° C. While keeping the temperature of the reaction system at 20° C. or lower, 50 g (0.31 mol) of para-acetoxystyrene was added dropwise over a period of 30 minutes. Then, this state was kept for 30 minutes to prepare a tetrahydrofuran solution of potassium p-vinylphenolate colored in yellow-orange. The obtained solution was cooled with iced water, and while keeping the temperature at 20° C. or lower, 60 mL of a tetrahydrofuran solution of 67.28 g (0.31 mol) of di-t-butyl carbonate was added dropwise. The resultant solution was further stirred for 1 hour at room temperature. To the obtained solution, 300 mL of saturated saline was added, and after shaking, an organic phase separated from an aqueous phase was fractionated. Anhydrous sodium sulfate was added to the obtained organic phase to remove moisture, and then the solvent was distilled off to obtain a concentrate. The obtained concentrate was dried under reduced pressure to obtain 65 g of p-t-butoxycarbonyloxystyrene having a boiling point of 90 to 92° C. under a pressure of 26.7 Pa. The p-t-butoxycarbonyloxystyrene (monomer) obtained as described above was further distilled in the presence of $CaH_2$ and then purified using sodium benzophenone to remove impurities such as moisture.

In a 2-liter flask, 1,200 mL of tetrahydrofuran as a solvent and $5.0 \times 10^{-3}$ mol of n-butyllithium as a polymerization initiator were charged and cooled to −78° C. Then, 60 g of the previously synthesized p-t-butoxycarbonyloxystyrene monomer (dissolved in 50 mL of tetrahydrofuran and cooled to −78° C.) was added, and when living polymerization reaction was carried out for 1 hour, the solution turned red. The reaction was terminated by adding methanol to the reaction solution to terminate the living polymerization reaction. Next, the obtained reaction mixture was poured into methanol to precipitate the polymer, which was then separated and dried to obtain 60 g of a white polymer. As a result of $^1$H-NMR and IR measurement of the obtained polymer, the polymer was poly(p-t-butoxycarbonyloxystyrene) in which unreacted active terminals remained in p-t-butoxycarbonyloxy groups, and from the result of a GPC elution curve, it was confirmed that the polymer had monodispersity (Mw/Mn=1.20). The number average molecular weight measured by membrane osmometry was 10,000 g/mol.

In 1,500 mL of acetone, 50 g of synthesized poly(p-t-butoxycarbonyloxystyrene) was dissolved, and a small amount of hydrochloric acid was added at 60° C. The resultant solution was stirred for 8 hours. Then, the solution was poured in water to precipitate the polymer, which is then washed and separated/dried to obtain 30 g of (PHS-1) an alkali-soluble resin which is a poly(p-hydroxystyrene) resin.

From the GPC elution curve of the obtained polymer, it was confirmed that the monodispersity was extremely high.

In a $^1$H-NMR spectrum of the obtained polymer, a peak derived from the p-t-butoxycarbonyloxy group disappeared, and in an IR spectrum, a characteristic absorption band corresponding to poly(p-hydroxystyrene) appeared. From these results, it was confirmed that the obtained polymer was monodisperse poly(p-hydroxystyrene). The number average molecular weight of the obtained polymer measured by membrane osmometry was 6,000 g/mol.

Preparation Example 1: Preparation of (Bk-1) Pigment Dispersion Liquid

After weighing and mixing 138.0 g of a 30% by weight MBA solution of (PI-1) the alkali-soluble resin obtained in Synthesis Example 4, 13.8 g of "SOLSPERSE (a registered trademark)" 20000 (manufactured by The Lubrizol Corporation; polyether-based dispersant) (S-20000), 685.4 g of MBA, and 82.8 g of "IRGAPHOR (a registered trademark)" BLACK S0100CF (benzofuranone based black pigment having a primary particle diameter of 40 to 80 nm, manufactured by BASF SE) (Bk-S0100CF), the resultant mixture was stirred for 20 minutes in a high speed disperser (Homodisper, Model 2.5, manufactured by PRIMIX Corporation) to provide a preliminary dispersion liquid. In Ultra Apex Mill (UAM-015, manufactured by Kotobuki Industries Co., Ltd.) equipped with a centrifugal separator filled to 75% with zirconia crushing balls with a diameter of 0.30 mmφ (YTZ, manufactured by Tosoh Corporation), the preliminary dispersion liquid obtained was fed and treated for 3 hours at a rotor peripheral speed of 7.0 m/s to provide (Bk-1) a pigment dispersion liquid with a solid content of 15% by weight and a coloring agent/resin/dispersant ratio of 60/30/10 (by weight). The pigment in the resulting pigment dispersion liquid had a number average particle diameter of 100 nm.

Preparation Examples 2 to 6: Preparation of (Bk-2) Pigment Dispersion Liquid to (Bk-6) Pigment Dispersion Liquid (Bk-2) A pigment dispersion liquid to (Bk-6) a pigment dispersion liquid were obtained in the same manner as in Preparation Example 1 except for changing the types and contents of (C) the coloring material, (A) the alkali-soluble resin, and (F) the dispersant as listed in Table 3.

The compositions and the number average particle diameters of the pigment in Preparation Examples 1 to 6 are summarized in Table 3.

TABLE 3

| Preparation Example | Dispersion liquid | Composition [% by weight] | | | Number average particle diameter |
|---|---|---|---|---|---|
| | | (C) Coloring material | (A) Alkali-soluble resin | (F) Dispersant | |
| 1 | Pigment dispersion liquid (Bk-1) | Bk-S0100CF (60) | Polyimide (PI-1) (30) | S-20000 (10) | 100 nm |
| 2 | Pigment dispersion liquid (Bk-2) | Bk-S0100CF (60) | Polyimide precursor (PIP-1) (20) | S-20000 (20) | 110 nm |
| 3 | Pigment dispersion liquid (Bk-3) | Bk-S0100CF (60) | Cardo based resin (CD-1) (20) | S-20000 (20) | 110 nm |
| 4 | Pigment dispersion liquid (Bk-4) | Bk-S0100CF (60) | Acrylic resin (AC-1) (20) | S-20000 (20) | 110 nm |
| 5 | Pigment dispersion liquid (Bk-5) | Bk-S0100CF (60) | Novolac resin (NV-1) (20) | S-20000 (20) | 130 nm |

TABLE 3-continued

| Preparation Example | Dispersion liquid | Composition [% by weight] | | | Number average particle diameter |
|---|---|---|---|---|---|
| | | (C) Coloring material | (A) Alkali-soluble resin | (F) Dispersant | |
| 6 | Pigment dispersion liquid (Bk-6) | Bk-S0100CF (60) | Poly(p-hydroxystyrene) resin (PHS-1) (20) | S-20000 (20) | 130 nm |

Preparation Example 7: Preparation of Photosensitive Resin Composition 1

Under yellow light, 0.256 g of "ADEKA ARKLS" NCI-831 (manufactured by ADEKA Corporation) (NCI-831) as a photosensitizer was added to 10.186 g of MBA, followed by stirring to ensure dissolution. Then, 0.300 g of a 30% by weight MBA solution of (PI-1) the alkali-soluble resin obtained in Synthesis Example 4, 2.275 g of 30% by weight MBA solution of (PIP-1) the alkali-soluble resin obtained in Synthesis Example 5, and 1.422 g of an 80% by weight MBA solution of "KAYARAD" DPHA (manufactured by Nippon Kayaku Co., Ltd.; dipentaerythritol hexaacrylate) (DPHA) as a radical-polymerizable compound were added and stirred to provide a preparation liquid as a uniform solution. Subsequently, 12.968 g of (Bk-1) the pigment dispersion liquid obtained in Preparation Example 1 was weighed, and to this, 12.032 g of the preparation liquid obtained above was added and stirred to provide a uniform solution. Afterward, the obtained solution was filtered through a filter with a pore size of 0.45 µmφ to prepare a photosensitive resin composition 1.

Preparation Examples 8 to 13

Photosensitive resin compositions 2 to 7 were prepared in the same manner as in Preparation Example 7 except for changing the types of the pigment dispersion liquid, (A) the alkali-soluble resin, (B) the photosensitizer, and (G) the radical-polymerizable compound as listed in Table 4.

The compositions in Preparation Examples 8 to 13 are summarized in Table 4.

TABLE 4

| | | | Composition [part(s) by weight] | | | | | | | |
|---|---|---|---|---|---|---|---|---|---|---|
| | | | (A) Alkali-soluble resin | | | | | | | |
| Preparation Example | Photosensitive resin composition | Pigment dispersion liquid | Resin derived from pigment dispersion liquid | Resin derived from preparation liquid added to pigment dispersion liquid | | (B) Photo-sensitizer | (C) Coloring material | (F) Dispersant | (G) Radical-polymerizable compound | (D) Organic solvent |
| 7 | 1 | Bk-1 | PI-1 (26.3) | PI-1 (21.7) | PIP-1 (12) | NCI-831 (9) | Bk-S0100CF (52.7) | S-20000 (8.8) | DPHA (40) | MBA |
| 8 | 2 | Bk-2 | PIP-1 (19.2) | PI-1 (24) | PIP-1 (16.8) | NCI-831 (9) | Bk-S0100CF (57.5) | S-20000 (19.2) | DPHA (40) | MBA |
| 9 | 3 | Bk-1 | PI-1 (26.3) | PI-1 (15.7) | PIP-1 (28) | NCI-831 (9) | Bk-S0100CF (52.7) | S-20000 (8.8) | DPHA (30) | MBA |
| 10 | 4 | Bk-3 | CD-1 (19.2) | CD-1 (40.8) | — | NCI-831 (9) | Bk-S0100CF (57.5) | S-20000 (19.2) | DPHA (40) | MBA |
| 11 | 5 | Bk-4 | AC-1 (19.2) | AC-1 (40.8) | — | NCI-831 (9) | Bk-S0100CF (57.5) | S-20000 (19.2) | DPHA (40) | MBA |
| 12 | 6 | Bk-5 | NV-1 (19.2) | NV-1 (40.8) | — | NCI-831 (9) | Bk-S0100CF (57.5) | S-20000 (19.2) | DPHA (40) | MBA |
| 13 | 7 | Bk-6 | PHS-1 (19.2) | PHS-1 (40.8) | — | NCI-831 (9) | Bk-S0100CF (57.5) | S-20000 (19.2) | DPHA (40) | MBA |

Preparation Example 14: Preparation of Photosensitive Resin Composition 8

In a mixed solvent of 32.0 g of propylene glycol monomethyl ether (PGME) and 8.0 g of γ-butyrolactone (GBL), 10.0 g of (A-1) the alkali-soluble resin obtained in Synthesis Example 2 described above and 1.2 g of (B-1) the photosensitizer obtained in Synthesis Example 3 were dissolved, after which the solution was filtered through a polytetrafluoroethylene-made filter of 0.2 µm (manufactured by Sumitomo Electric Industries, Ltd.) to obtain a photosensitive resin composition 8.

<Production of Circularly Polarizing Plate>
(Production of Polycarbonate Resin Film)

Diphenyl carbonate (manufactured by Mitsubishi Chemical Corporation) (DPC) and bisphenol A (manufactured by Mitsubishi Chemical Corporation) (BPA) were mixed such that a molar ratio DPC/BPA was 1.050 to prepare a melt of a raw material mixture at a temperature of 155° C. The raw material melt was continuously fed into a first vertical stirring reactor controlled to 220° C. and 13.3×10³ Pa and having a capacity of 10 m³ through a raw material feed pipe at a flow rate of 4,400 kg/hour, and while controlling an opening degree of a valve provided on a polymer discharge line of a bottom of the reactor such that an average residence time was 60 minutes, the liquid level was kept constant. Simultaneously with initiation of feeding the raw material melt, an aqueous cesium carbonate solution as a catalyst was continuously fed at a rate of 0.5 µmol per 1 mol of BPA (1.0 µmol per 1 mol of BPA as a metal amount).

Successively, the reaction solution discharged from the bottom of the reactor was continuously fed to second and third vertical stirring reactors (capacity: 10 m$^3$) and a fourth horizontal reactor (capacity: 15 m$^3$) in a sequential manner and drawn out through a polymer discharge port of a bottom of the fourth reactor. As the fourth reactor, a biaxial horizontal reactor was used. The peripheral speed of a stirring shaft of the fourth reactor was 8.8 cm/s, and the diameter of the stirring shaft was 560 mm.

Next, the polymer in the molten state drawn out through the polymer discharge port of the bottom of the fourth reactor was sent to a twin-screw extruder (manufactured by The Japan Steel Works, Ltd.; screw diameter: 0.174 m, L/D=39 (here, L means the diameter of the screw, and D means the total length of the screw)) equipped with a polymer filter at a die exit. Butyl p-toluenesulfonate (5 times molar amount with respect to cesium carbonate used as a catalyst) was continuously kneaded, drawn out in a strand form from the die, and cut with a cutter to obtain polycarbonate resin pellets (viscosity average molecular weight (Mv): 21,000).

Reaction conditions in the second to fourth reactors were as follows. The second reactor: 260° C., 4.00×103 Pa, 75 rpm. The third reactor: 270° C., 200 Pa, 75 rpm. The fourth reactor: 280° C., 67 Pa, 4 rpm. Along with the progress of the reaction, those reactors were set to high temperature and high vacuum. The liquid level was controlled such that during the reaction, the average residence time of the second and third reactors was 60 minutes, and the average residence time of the fourth reactor was 90 minutes, and, at the same time, by-produced phenol was distilled off. At this time, the viscosity average molecular weight (Mv) of the reaction solution at the exit of the fourth reactor was 21,000, and the melt viscosity at 280° C. was about 1,000 Pa·s.

As the polymer filter in the reactor, a commercially available product of a leaf disk type polymer filter (manufactured by Nihon Pall Ltd.; metal nonwoven fabric type having an absolute filtration accuracy of 20 µm (material: SUS 316 L)) was used.

The obtained polycarbonate resin was vacuum-dried at 80° C. for 5 hours, and then a polycarbonate resin film having a thickness of 100 µm was formed using a film production apparatus equipped with a single-screw extruder (manufactured by Isuzu Kakoki KK; screw diameter, 25 mm; set cylinder temperature, 220° C.), a T-die (width, 200 mm; set temperature, 220° C.), a chill roll (set temperature, 120 to 130° C.), and a winder.

(Production of Phase Difference Film)

A sample having a width of 350 mm and a length of 700 mm was cut out of the polycarbonate resin film obtained by the above-mentioned method. This sample was subjected to uniaxial stretching using a batch-type biaxially stretching apparatus KARO IV (manufactured by Brückner Maschinenbau GmbH & Co.KG) at a stretching temperature of glass transition temperature+4° C. and a stretching speed of 180 mm/min (strain rate, 300%/min) in a stretch ratio of 1×2.0 to obtain a transparent film. In this operation, the sample was stretched while being not held along the direction orthogonal to the stretch direction. Thus, a phase difference film having a thickness of 70 µm was obtained.

(Production of Circularly Polarizing Plate)

One surface of the phase difference film obtained by the above-mentioned method was subjected to corona treatment. On the other hand, 67 parts by weight of isopropyl alcohol was mixed with 100 parts by weight of a silane compound (manufactured by Nippon Unicar Company Limited, product name: APZ6601) represented by the chemical formula: $NH_2CH_2NHCH_2CH_2Si(OC_2H_5)_3$ to prepare a silane compound solution having a concentration of 60% by weight. The obtained silane compound solution was applied on the corona treatment surface of the phase difference film and dried at 120° C. for 2 minutes to form an easy adhesion layer having a thickness of 40 nm on the phase difference film.

Then, the phase difference film on which the easy adhesion layer was formed was attached to one side of a polarizer, used for a commercially available polarizing plate (manufactured by Nitto Denko Corporation; product name "CVS1775SDUHC"), through a PVA-based adhesive such that the easy adhesion layer was disposed on the polarizer side. At that time, the slow axis of the phase difference film and the absorption axis of the polarizer formed an angle of 45°. A TAC film (manufactured by Fujifilm Corporation, trade name: FUJITAC UV80) subjected to saponification treatment was attached to another side of the polarizer through the PVA-based adhesive. The laminate was dried at 70° C. for 10 minutes, and a piece measuring 330 mm by 250 mm was cut out of the laminate to provide a circularly polarizing plate.

<Production of Ultraviolet Absorbing Plate A>

A polycarbonate resin film obtained by the method described in the production of the circularly polarizing plate was used as an ultraviolet absorbing plate A.

<Production of Ultraviolet Absorbing Plate B>

A resin composition containing 0.1% by weight of $SiO_2$ particles having an average particle diameter of 0.25 µm as an additive together with polyethylene terephthalate (PET) (intrinsic viscosity [η]=0.65) was dried so that the water content would be 50 ppm or less, then fed to an extruder, melted at 280° C., then filtered through a fiber sintered metal filter for removing foreign matters of not less than 10 µm, and introduced into a die, and a molten film was extruded. While electrostatic charges were applied from a wire-shaped electrode to the molten film, the molten film was brought into close contact with a cooling roll and cooled to obtain an extruded film. The obtained extruded film was preheated at a preheating temperature of 80° C., stretched 3.0 times at a stretching temperature of 90° C. using a roll-type longitudinal stretching machine, and then cooled to a glass transition temperature or lower. In succession, the obtained longitudinally stretched film was introduced into a tenter while being held at both the edges by clips, stretched to 3.5 times in the width direction in hot air atmosphere heated to a stretching temperature of 105° C., and then heatset at 235° C. The film formation rate was 50 m/min, and the thickness of the obtained stretched film was 100 µm.

<Production of Ultraviolet Absorbing Plate C>

2-Chloro-p-phenylenediamine corresponding to 85 mol % and 4,4'-diaminodiphenyl ether corresponding to 15 mol % were dissolved in dehydrated NMP, to this was added 2-chloroterephthalic acid chloride corresponding to 98.5 mol %, and the mixture was stirred at 30° C. or lower for about 2 hours to polymerize an aromatic polyamide. The resulting aromatic polyamide solution was neutralized with lithium carbonate, diethanolamine, and triethanolamine, then poured into a large amount of water, and reprecipitated/dried to obtain a powdery aromatic polyamide. Afterward, the obtained aromatic polyamide powder was dissolved in NMP to obtain an aromatic polyamide solution.

Then, the aromatic polyamide solution was applied on a stainless steel plate using an applicator and dried at a hot air temperature of 120° C. and a support temperature of 150° C. until the film had self-supporting properties, and then a gel film was peeled from the stainless steel plate. Next, the gel film was fixed to a metal frame, and a residual solvent was extracted with water in a water tank at a water temperature of 80° C. After the extraction with water, the moisture content on both sides of the water-containing film was wiped off with gauze, and the film was heat-treated in an oven at 250° C. while being fixed to the metal frame, to obtain an ultraviolet absorbing plate C having a thickness of 75 μm.

<Production of Ultraviolet Absorbing Plate D>

In a 200-mL four neck flask in a dry nitrogen flow, 14.6181 g (49.7 mmol) of 3,3',4,4'-biphenyltetracarboxylic acid dianhydride (BPDA), 1.3611 g (2.6 mmol) of 2,2-bis(4-(3,4-dicarboxyphenoxy)phenyl)propane dianhydride (BSAA), 5.9721 g (52.3 mmol) of trans-1,4-diaminocyclohexane (CHDA), and 100 g of NMP were added, and the mixture was heated and stirred at 65° C. After 6 hours, the resulting product was cooled to provide a varnish.

A glass substrate with a size of 300 mm×400 mm×0.7 mm thickness (AN100 (Asahi Glass Co., Ltd.)) was spin-coated with the synthesized varnish such that the thickness would be 50 μm after 4-minute prebaking at 140° C. Afterward, prebaking treatment was carried out at 140° C. for 4 minutes using a hot plate.

The prebaked coating film was placed in an inert gas oven and heated in a nitrogen flow (oxygen concentration: 20 ppm or less) up to 300° C. at a temperature increase rate of 3.5° C./min, maintained at 300° C. for 30 minutes, and cooled down to 50° C. at a temperature decrease rate of 5° C./rain to produce a polyimide resin film (on a glass substrate).

Afterward, incisions were made in the periphery of the polyimide resin film prepared on the glass substrate, followed by immersion in water for 12 hours to remove the polyimide resin film from the glass substrate, thus obtaining an ultraviolet absorbing plate D having a film thickness of 40 μm.

<Production of Ultraviolet Absorbing Plate E>

Cellulose acetate propionate (acetyl group substitution degree: 1.4, propionyl group substitution degree: 1.3, molecular weight Mn=86,000, Mw/Mn=2.5) was dried in air at 130° C. under atmospheric pressure for 2 hours and cooled to room temperature. To 100 parts by weight of the cellulose acetate propionate was added 2.3 parts by weight of an A ultraviolet absorbing agent represented by the following structural formula, 0.5 parts by weight of IRGANOX 1010 (manufactured by Ciba Specialty Chemicals Corporation), 0.25 parts by weight of GSY-P101 (manufactured by Sakai Chemical Industry Co., Ltd.), 0.3 parts by weight of a B stabilizer represented by the following structural formula, and 8.0 parts by weight of a C plasticizer represented by the following structural formula. The mixture was heated and melted at 250° C., then melt extrusion-molded from a T-die, and further stretched at 160° C. with a stretching ratio of 1.2×1.2 to obtain an ultraviolet absorbing plate E having a film thickness of 40 μm.

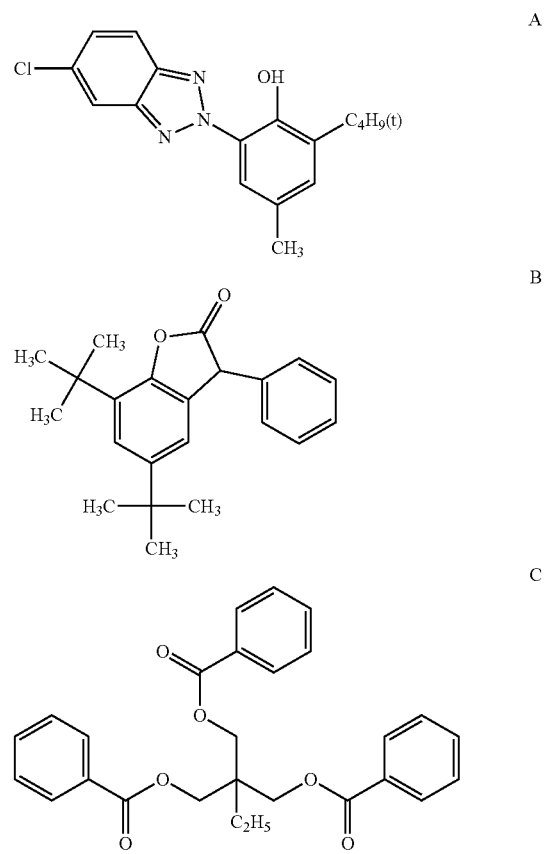

Figure 4:
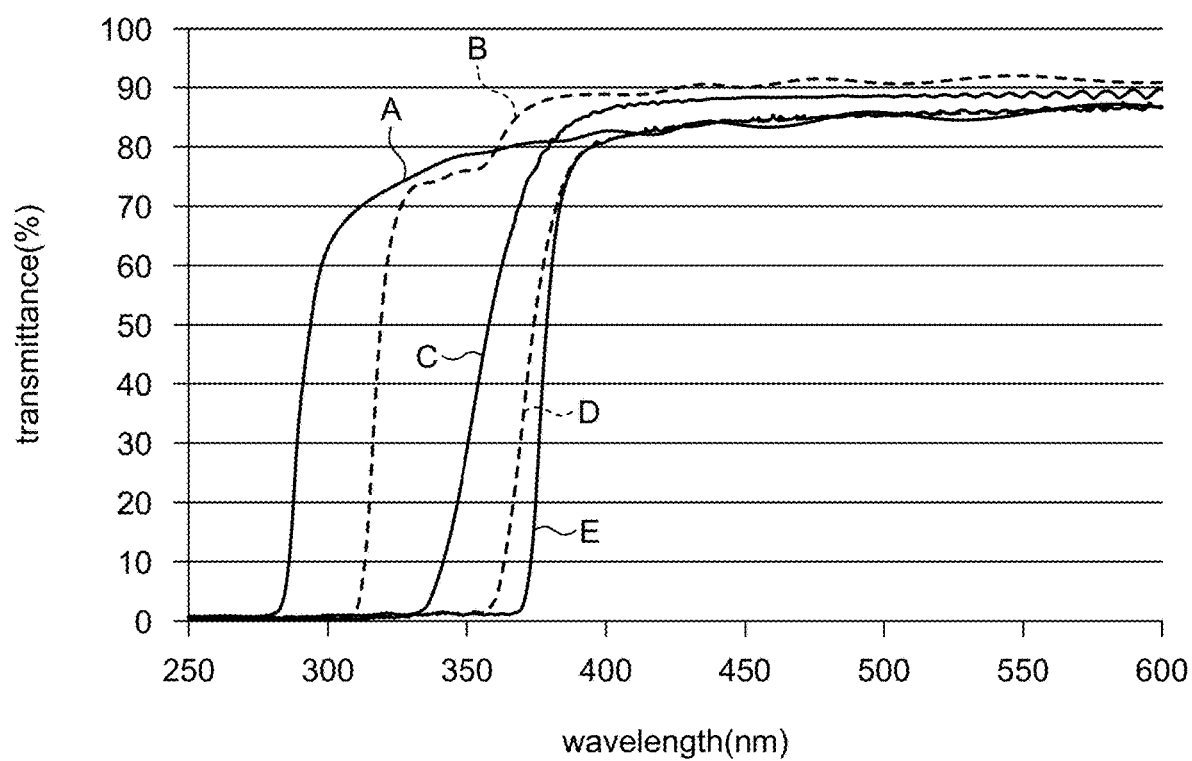
FIG. 4 is a graph illustrating a relation between wavelength and transmittance of an ultraviolet absorbing plate used in examples and comparative examples.

The transmittances of the obtained ultraviolet absorbing plates A to E were measured with a spectrophotometer (U-4100; manufactured by Hitachi High-Technologies Corporation). The measurement results are listed in Table 4. In the graph illustrated in FIG. 4, the horizontal axis represents wavelength (nm), and the vertical axis represents transmittance (%).

Examples 1 to 20 and Comparative Examples 1 to 22

Figure 5A:
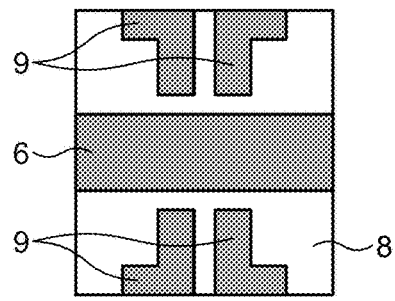
FIG. 5A is a first schematic view of a procedure for manufacturing the organic EL display device in the example.
Figure 5B:
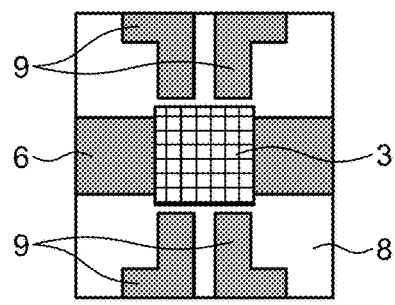
FIG. 5B is a second schematic view of the procedure for manufacturing the organic EL display device in the example.

An outline of a manufacturing procedure of the organic EL display device will be described with reference to FIGS. 5A to 5D. First, a metal layer (its composition is listed in Table 1) having a thickness of 100 nm of a non-transparent electrode listed in Table 5 and an ITO transparent electric conductive film having a thickness of 10 nm were formed on the entire surface of a 38 mm×46 mm non-alkali glass substrate 8 by a sputtering method and etched as the first electrode (non-transparent electrode) 6. However, only in Example 18 and Comparative Example 17, the ITO transparent electric conductive film was not formed. At the same time, auxiliary electrodes 9 used for taking out the second electrodes 7 were also formed (FIG. 5A). The resulting substrate was subjected to ultrasonic cleaning for 10 minutes with Semico Clean 56 (trade name, manufactured by Furuuchi Chemical Corporation) and then washed with ultrapure water. Then, the photosensitive resin composition listed in Table 5 was applied on the entire surface of the substrate by a spin coating method and prebaked for 2 minutes on a hot plate maintained at 120° C. This film was subjected to UV exposure through a photomask, after which the film was subjected to development with a 2.38% by weight aqueous TMAH solution to make an unnecessary portion dissolve, and then, the film was rinsed with pure water. The obtained resin pattern was cured for 60 minutes at 250° C. under a nitrogen atmosphere, using a high-temperature inert gas oven (INH-9CD-S; manufactured by Koyo Thermo Systems Co., Ltd.). In this manner, the insulating layer 3 having a configuration such that opening sections each having a width of 70 μm and a length of 260 μm were arranged at a pitch of 155 μm in the width direction and a pitch of 465 μm in the length direction and each of the opening sections had a shape that enabled the exposure of the first electrode 6 was formed only on a substrate active area (FIG. 5B). In this manner, the insulating layer 3 having an insulating layer opening ratio of 25% was formed on the substrate active area (display area) that had a 16 mm-square tetragonal shape. The thickness of the insulating layer 3 was about 1.0 μm.

Figure 5C:
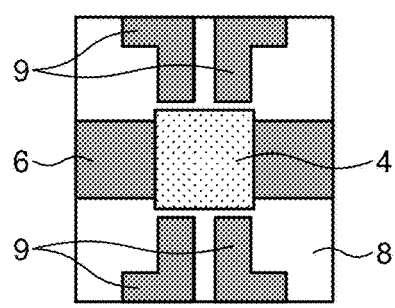
FIG. 5C is a third schematic view of the procedure for manufacturing the organic EL display device in the example.

Next, a nitrogen plasma treatment was carried out as a pretreatment, and then the organic EL layer 4 containing a light-emitting layer was formed by a vacuum deposition method (FIG. 5C). The vacuum degree during deposition was $1 \times 10^{-3}$ Pa or less, and the substrate was rotated relative to a deposition source during deposition. First, a compound (HT-1) was deposited at a thickness of 10 nm as a hole injection layer, and a compound (HT-2) was deposited at a thickness of 50 nm as a hole transporting layer. Subsequently, a compound (GH-1) that served as a host material and a compound (GD-1) that served as a dopant material were deposited as a light-emitting layer at a thickness of 40 nm in such a manner that the dope concentration became 10%. Subsequently, a compound (ET-1) and a compound (LiQ) that served as electron transport materials were laminated at a thickness of 40 nm and at a volume ratio of 1:1. The structures of the compounds used in the organic EL layer are as follows.

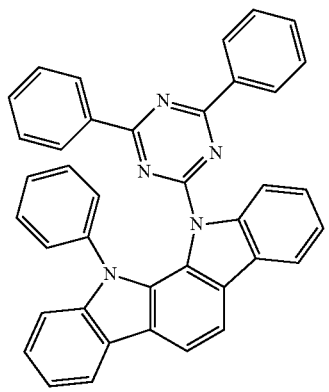

GH-1

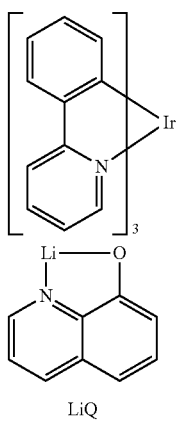

GD-1

LiQ

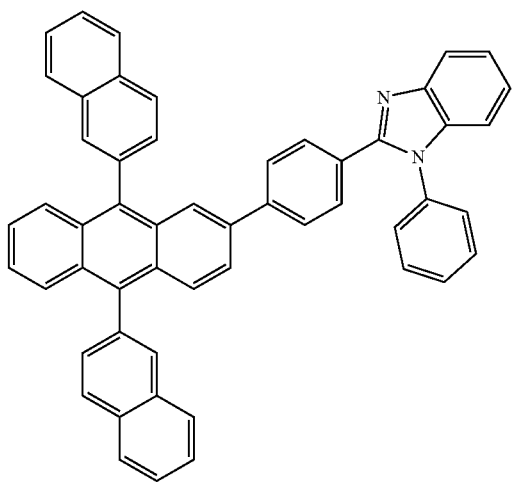

ET-1

HT-1

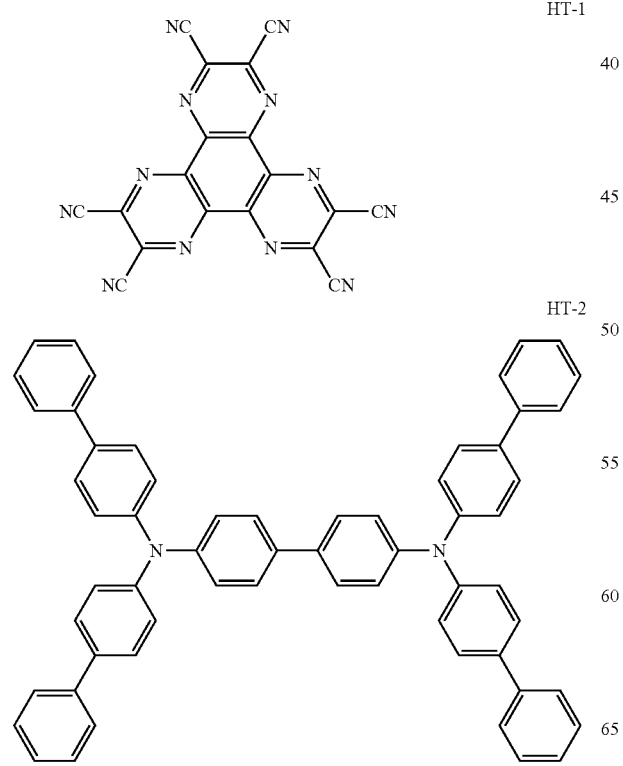

HT-2

Figure 5D:
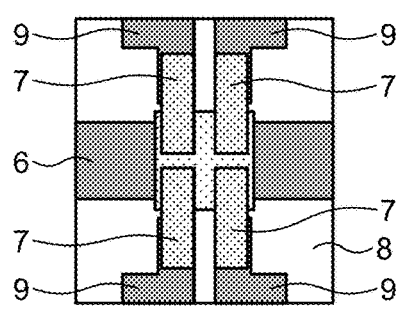
FIG. 5D is a fourth schematic view of the procedure for manufacturing the organic EL display device in the example.

Next, the compound (LiQ) was deposited at a thickness of 2 nm, and then Mg and Ag were deposited at a thickness of 10 nm at a volume ratio of 10:1 to produce the second electrodes (transparent electrodes) 7 (FIG. 5D). Finally, the resultant product was sealed by bonding a cap-shaped glass plate using an epoxy resin-type adhesive agent under a low-moisture nitrogen atmosphere. In this manner, four organic EL display devices of the top-emission type each having a 5 mm-square tetragonal shape were produced on a single substrate. The term "film thickness" as used herein refers to a displayed value on a quartz oscillation-type film thickness monitor. When the same film as the second electrodes was measured in the same manner as the evaluation of the non-transparent electrode, the transmittance was 50%.

With the exception of Example 9, the circularly polarizing plate and the ultraviolet absorbing plate obtained by the above-mentioned method were superimposed on the front side of the organic EL display device and mounted. The combination in each example is listed in Table 5.

The configuration of the organic EL display device is listed in Table 5. For the obtained organic EL display device, the evaluation results obtained by the above-mentioned method are listed in Table 6.

TABLE 5

| | Nontransparent electrode | Photosensitive resin composition | Circularly Polarizing Plate | Ultraviolet absorbing plate |
|---|---|---|---|---|
| Comparative Example 1 | 1 | 1 | Absent | D |
| Comparative Example 2 | 1 | 2 | Absent | D |
| Comparative Example 3 | 1 | 3 | Absent | D |
| Comparative Example 4 | 2 | 1 | Absent | D |
| Comparative Example 5 | 3 | 1 | Absent | D |
| Comparative Example 6 | 4 | 1 | Absent | D |
| Example 1 | 5 | 1 | Absent | D |
| Example 2 | 8 | 1 | Absent | D |
| Example 3 | 9 | 1 | Absent | D |
| Example 4 | 10 | 1 | Absent | D |
| Example 5 | 11 | 1 | Absent | D |
| Example 6 | 12 | 1 | Absent | D |
| Example 7 | 9 | 2 | Absent | D |
| Example 8 | 9 | 3 | Absent | D |
| Example 9 | 9 | 1 | Present | Absent |
| Example 10 | 9 | 1 | Absent | Absent |
| Example 11 | 9 | 1 | Absent | A |
| Example 12 | 9 | 1 | Absent | B |
| Example 13 | 9 | 1 | Absent | C |
| Example 14 | 9 | 1 | Absent | E |
| Example 15 | 9 | 4 | Absent | D |
| Example 16 | 9 | 5 | Absent | D |
| Example 17 | 13 | 1 | Absent | D |
| Example 18 | 9 | 1 | Absent | D |
| Example 19 | 9 | 6 | Absent | D |
| Example 20 | 9 | 7 | Absent | D |
| Comparative Example 7 | 9 | 8 | Absent | D |
| Comparative Example 8 | 1 | 1 | Present | Absent |
| Comparative Example 9 | 1 | 1 | Absent | Absent |
| Comparative Example 10 | 1 | 1 | Absent | A |
| Comparative Example 11 | 1 | 1 | Absent | B |
| Comparative Example 12 | 1 | 1 | Absent | C |
| Comparative Example 13 | 1 | 1 | Absent | E |
| Comparative Example 14 | 1 | 4 | Absent | D |
| Comparative Example 15 | 1 | 5 | Absent | D |
| Comparative Example 16 | 6 | 1 | Absent | D |
| Comparative Example 17 | 1 | 1 | Absent | D |
| Comparative Example 18 | 1 | 6 | Absent | D |
| Comparative Example 19 | 1 | 7 | Absent | D |
| Comparative Example 20 | 7 | 1 | Absent | D |
| Comparative Example 21 | 7 | 8 | Absent | D |
| Comparative Example 22 | 1 | 8 | Absent | D |
| Comparative Example 23 | 9 | 1 | Absent | D |
| Comparative Example 24 | 9 | 1 | Absent | D |

TABLE 6

| | Reflectance (%) | Dark luminance (cd/m$^2$) | Bright luminance (cd/m$^2$) | Chromaticity x, y (color shift judgement) | Contrast (dark:bright) | Reliability (%) | | | |
|---|---|---|---|---|---|---|---|---|---|
| | | | | | | 0 h | 250 h | 500 h | 1000 h |
| Comparative Example 1 | 15 | 1892 | 3884 | 0.345, 0.605 (A) | 1:2.05 | 100 | 97 | 95 | 90 |
| Comparative Example 2 | 15 | 1904 | 3899 | 0.357, 0.601 (A) | 1:2.05 | 100 | 97 | 94 | 89 |
| Comparative Example 3 | 17 | 1943 | 3909 | 0.356, 0.609 (A) | 1:2.01 | 100 | 98 | 96 | 89 |
| Comparative Example 4 | 14 | 1847 | 3862 | 0.352, 0.606 (A) | 1:2.09 | 100 | 97 | 95 | 90 |
| Comparative Example 5 | 12 | 1698 | 3701 | 0.341, 0.594 (A) | 1:2.18 | 100 | 96 | 94 | 90 |
| Comparative Example 6 | 10 | 1508 | 3516 | 0.349, 0.602 (A) | 1:2.33 | 100 | 98 | 96 | 90 |
| Example 1 | 9 | 1336 | 3368 | 0.346, 0.593 (A) | 1:2.52 | 100 | 97 | 95 | 90 |
| Example 2 | 9 | 1442 | 3510 | 0.356, 0.608 (A) | 1:2.43 | 100 | 97 | 95 | 90 |
| Example 3 | 8 | 1132 | 3321 | 0.344, 0.608 (A) | 1:2.93 | 100 | 98 | 96 | 91 |
| Example 4 | 8 | 1181 | 3349 | 0.346, 0.605 (A) | 1:2.84 | 100 | 98 | 97 | 91 |
| Example 5 | 7 | 1150 | 2954 | 0.357, 0.601 (A) | 1:2.57 | 100 | 99 | 97 | 92 |
| Example 6 | 7 | 1005 | 2487 | 0.349, 0.602 (A) | 1:2.47 | 100 | 99 | 98 | 93 |

TABLE 6-continued

| | Reflectance (%) | Dark luminance (cd/m$^2$) | Bright luminance (cd/m$^2$) | Chromaticity x, y (color shift judgement) | Contrast (dark:bright) | Reliability (%) | | | |
|---|---|---|---|---|---|---|---|---|---|
| | | | | | | 0 h | 250 h | 500 h | 1000 h |
| Example 7 | 8 | 1333 | 3321 | 0.354, 0.601 (A) | 1:2.49 | 100 | 98 | 94 | 89 |
| Example 8 | 8 | 1351 | 3342 | 0.356, 0.608 (A) | 1:2.47 | 100 | 99 | 97 | 89 |
| Example 9 | 7 | 786 | 1921 | 0.346, 0.599 (A) | 1:2.44 | 100 | 100 | 97 | 95 |
| Example 10 | 13 | 1262 | 3729 | 0.351, 0.599 (A) | 1:2.96 | 100 | 93 | 78 | 53 |
| Example 11 | 13 | 1275 | 3896 | 0.345, 0.604 (A) | 1:3.06 | 100 | 92 | 84 | 61 |
| Example 12 | 14 | 1251 | 3890 | 0.346, 0.605 (A) | 1:3.11 | 100 | 93 | 88 | 69 |
| Example 13 | 13 | 1251 | 3887 | 0.345, 0.606 (A) | 1:3.11 | 100 | 96 | 93 | 81 |
| Example 14 | 14 | 1242 | 3887 | 0.344, 0.605 (A) | 1:3.13 | 100 | 100 | 98 | 94 |
| Example 15 | 16 | 1333 | 3888 | 0.344, 0.608 (A) | 1:2.92 | 100 | 94 | 89 | 81 |
| Example 16 | 19 | 1295 | 3958 | 0.359, 0.603 (A) | 1:3.06 | 100 | 92 | 91 | 81 |
| Example 17 | 15 | 1315 | 3863 | 0.350, 0.601 (A) | 1:2.94 | 100 | 92 | 89 | 76 |
| Example 18 | 14 | 1047 | 2588 | 0.355, 0.599 (A) | 1:2.47 | 100 | 96 | 93 | 88 |
| Example 19 | 17 | 1283 | 4087 | 0.352, 0.590 (A) | 1:3.18 | 100 | 85 | 75 | 51 |
| Example 20 | 17 | 1321 | 4169 | 0.354, 0.592 (A) | 1:3.16 | 100 | 91 | 72 | 49 |
| Comparative Example 7 | 40 | 4506 | 6112 | 0.372, 0.532 (C) | 1:1.36 | 100 | 92 | 86 | 81 |
| Comparative Example 8 | 8 | 883 | 1685 | 0.346, 0.598 (A) | 1:1.91 | 100 | 99 | 97 | 95 |
| Comparative Example 9 | 13 | 1758 | 3722 | 0.351, 0.599 (A) | 1:2.12 | 100 | 93 | 77 | 52 |
| Comparative Example 10 | 14 | 1894 | 3890 | 0.345, 0604 (A) | 1:2.05 | 100 | 92 | 83 | 61 |
| Comparative Example 11 | 15 | 1890 | 3883 | 0.346, 0.605 (A) | 1:2.05 | 100 | 93 | 87 | 69 |
| Comparative Example 12 | 14 | 1893 | 3887 | 0.345, 0.606 (A) | 1:2.05 | 100 | 96 | 92 | 81 |
| Comparative Example 13 | 15 | 1897 | 3885 | 0.344, 0.605 (A) | 1:2.05 | 100 | 99 | 97 | 93 |
| Comparative Example 14 | 17 | 1958 | 3881 | 0.344, 0.608 (A) | 1:1.98 | 100 | 93 | 89 | 80 |
| Comparative Example 15 | 19 | 2063 | 3957 | 0.359, 0.603 (A) | 1:1.92 | 100 | 92 | 91 | 81 |
| Comparative Example 16 | 15 | 1863 | 3861 | 0.350, 0.601 (A) | 1:2.07 | 100 | 92 | 88 | 75 |
| Comparative Example 17 | 15 | 1886 | 3358 | 0.355, 0.599 (A) | 1:1.78 | 100 | 96 | 93 | 88 |
| Comparative Example 18 | 19 | 2055 | 4082 | 0.352, 0.590 (A) | 1:1.99 | 100 | 84 | 74 | 50 |
| Comparative Example 19 | 19 | 2246 | 4161 | 0.354, 0.592 (A) | 1:1.85 | 100 | 90 | 72 | 49 |
| Comparative Example 20 | 31 | 3278 | 4311 | 0.362, 0.585 (B) | 1:1.32 | 100 | 96 | 95 | 90 |
| Comparative Example 21 | 49 | 5218 | 6847 | 0.376, 0.560 (C) | 1:1.31 | 100 | 92 | 88 | 82 |
| Comparative Example 22 | 42 | 4603 | 6108 | 0.372, 0.532 (C) | 1:1.33 | 100 | 92 | 86 | 80 |
| Comparative Example 23 | 7 | 1102 | 2957 | 0.343, 0.609 (A) | 1:2.68 | 100 | 90 | 73 | 50 |
| Comparative Example 24 | 19 | 1802 | 3338 | 0.344, 0.607 (A) | 1:1.85 | 100 | 97 | 95 | 90 |

Comparative Example 23

A substrate was produced in the same manner as in Example 3 except that, due to a design change of the photomask, opening sections each had a width of 40 μm and a length of 55 μm and were arranged at a pitch of 155 μm in the width direction and a pitch of 465 μm in the length direction. An insulating layer having an insulating layer opening ratio of 3% was thus formed in the display area. The evaluation carried out using the substrate in the same manner as Example 3 demonstrated that the reliability was remarkably deteriorated.

Comparative Example 24

A substrate was produced in the same manner as in Example 3 except that, due to a design change of the photomask, opening sections each had a width of 100 μm and a length of 325 μm and were arranged at a pitch of 155 μm in the width direction and a pitch of 465 μm in the length direction. An insulating layer having an insulating layer opening ratio of 45% was thus formed in the display area. The evaluation carried out using the substrate in the same manner as Example 3 demonstrated that the reflectance of the surface of the organic EL display device significantly increased, and the contrast was degraded.

Description of Abbreviated Names of Compounds

ITO: indium tin oxide
KOH: potassium hydroxide

REFERENCE SIGNS LIST 1 substrate
2 first electrode (transparent electrode)
3 insulating layer
4 organic EL layer
5 second electrode (non-transparent electrode)
6 first electrode (non-transparent electrode)
7 second electrode (transparent electrode)
8 glass substrate
9 auxiliary electrode
10 organic EL display device
11 fluorescent lamp
12 spectroradiometer

The invention claimed is:

1. An organic EL display device comprising at least a transparent electrode, an organic EL layer, and a non-transparent electrode in this order and further comprising a black insulating layer that is disposed in a display side of the device, wherein
 the non-transparent electrode is mainly composed of one or more of Ag, Al, C, Cr, Cu, Mo, and Ni and has a reflectance of 25%±20%,
 the black insulating layer includes a benzofuranone based pigment, and
 the black insulating layer has an opening ratio in the display side area of 5% to 35%.

2. The organic EL display device according to claim 1, wherein no polarizing layer is present.

3. The organic EL display device according to claim 1, further comprising an ultraviolet absorbing layer.

4. The organic EL display device according to claim 1, wherein the insulating layer is a cured film of a photosensitive resin composition containing (C) a coloring material.

5. The organic EL display device according to claim 4, wherein the photosensitive resin composition further contains (A) an alkali-soluble resin and (B) a photosensitizer.

6. The organic EL display device according to claim 5, wherein (A) the alkali-soluble resin comprises a polyimide, a polyimide precursor, a polybenzoxazole, a polybenzoxazole precursor, a polysiloxane, an acrylic resin, and/or a cardo resin.

7. The organic EL display device according to claim 1, wherein the non-transparent electrode has a multilayer structure.

8. The organic EL display device according to claim 7, wherein, in the multilayer structure constituting the non-transparent electrode, an outermost surface layer is formed from a transparent electric conductive oxide material.

9. The organic EL display device according to claim 6, wherein the non-transparent electrode is mainly composed of one or more of Ag, Al, C, Cr, Cu, Mo, and Ni.

10. The organic EL display device according to claim 9, further comprising an ultraviolet absorbing layer.

* * * * *